(12) United States Patent
Lius et al.

(10) Patent No.: US 11,818,938 B2
(45) Date of Patent: Nov. 14, 2023

(54) DISPLAY PANEL AND ELECTRONIC DEVICE

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/866,586

(22) Filed: Jul. 18, 2022

(65) Prior Publication Data
US 2023/0056178 A1 Feb. 23, 2023

(30) Foreign Application Priority Data

Aug. 17, 2021 (CN) .......................... 202110943903.3

(51) Int. Cl.
| | |
|---|---|
| *G06F 3/041* | (2006.01) |
| *H10K 59/40* | (2023.01) |
| *G06F 3/044* | (2006.01) |
| *H10K 59/122* | (2023.01) |
| *H10K 59/35* | (2023.01) |

(52) U.S. Cl.
CPC ........... *H10K 59/40* (2023.02); *G06F 3/0412* (2013.01); *G06F 3/0446* (2019.05); *G06F 2203/04111* (2013.01); *G06F 2203/04112* (2013.01); *H10K 59/122* (2023.02); *H10K 59/351* (2023.02); *H10K 59/353* (2023.02)

(58) Field of Classification Search
None
See application file for complete search history.

(56) References Cited

U.S. PATENT DOCUMENTS

| | | | |
|---|---|---|---|
| 2020/0258953 A1* | 8/2020 | Bae | ................... H01L 27/3234 |
| 2020/0381495 A1 | 12/2020 | Jeon | |
| 2021/0005687 A1 | 1/2021 | Jeon | |

FOREIGN PATENT DOCUMENTS

TW  201913337 A  4/2019

* cited by examiner

*Primary Examiner* — Brian M Butcher
(74) *Attorney, Agent, or Firm* — Winston Hsu

(57) ABSTRACT

A display panel is disclosed and includes a substrate, a plurality of first light-emitting units, and a plurality of first mesh units. The substrate has a first display region, in which the first display region includes a transparent area. The first light-emitting units are disposed in the first display region and outside the transparent area in a top view direction of the display panel. The first mesh units are disposed in the first display region in the top view direction of the display panel, in which each of the first mesh units has a first mesh frame, and the first mesh frame forms a plurality of first mesh openings. The transparent area overlaps at least one of the first mesh openings in the top view direction of the display panel.

11 Claims, 15 Drawing Sheets

DISPLAY PANEL AND ELECTRONIC DEVICE

BACKGROUND OF THE DISCLOSURE

1. Field of the Disclosure

The present disclosure relates to a display panel and an electronic device.

2. Description of the Prior Art

Electronic devices have become necessary tools in people's lives because they can provide various needs for users. In one of the electronic devices integrated with a display panel, in order to increase screen-to-body ratio, it has been developed to install an image sensor under the display panel for detecting images. However, when a touch panel is disposed on the display panel, poor quality of detected images occurs and needs to be solved.

SUMMARY OF THE DISCLOSURE

According to an embodiment of the present disclosure, a display panel is provided and includes a substrate, a plurality of first light-emitting units, and a plurality of first mesh units. The substrate has a first display region, in which the first display region includes a transparent area. The first light-emitting units are disposed in the first display region and outside the transparent area in a top view direction of the display panel. The first mesh units are disposed in the first display region in the top view direction of the display panel, in which each of the first mesh units has a first mesh frame, and the first mesh frame forms a plurality of first mesh openings. The transparent area overlaps at least one of the first mesh openings in the top view direction of the display panel.

According to an embodiment of the present disclosure, an electronic device is provided and includes the display panel mentioned above and an optical sensor. The optical sensor is disposed under the first display region of the substrate.

These and other objectives of the present disclosure will no doubt become obvious to those of ordinary skill in the art after reading the following detailed description of the embodiment that is illustrated in the various figures and drawings.

DETAILED DESCRIPTION

Figure 1:
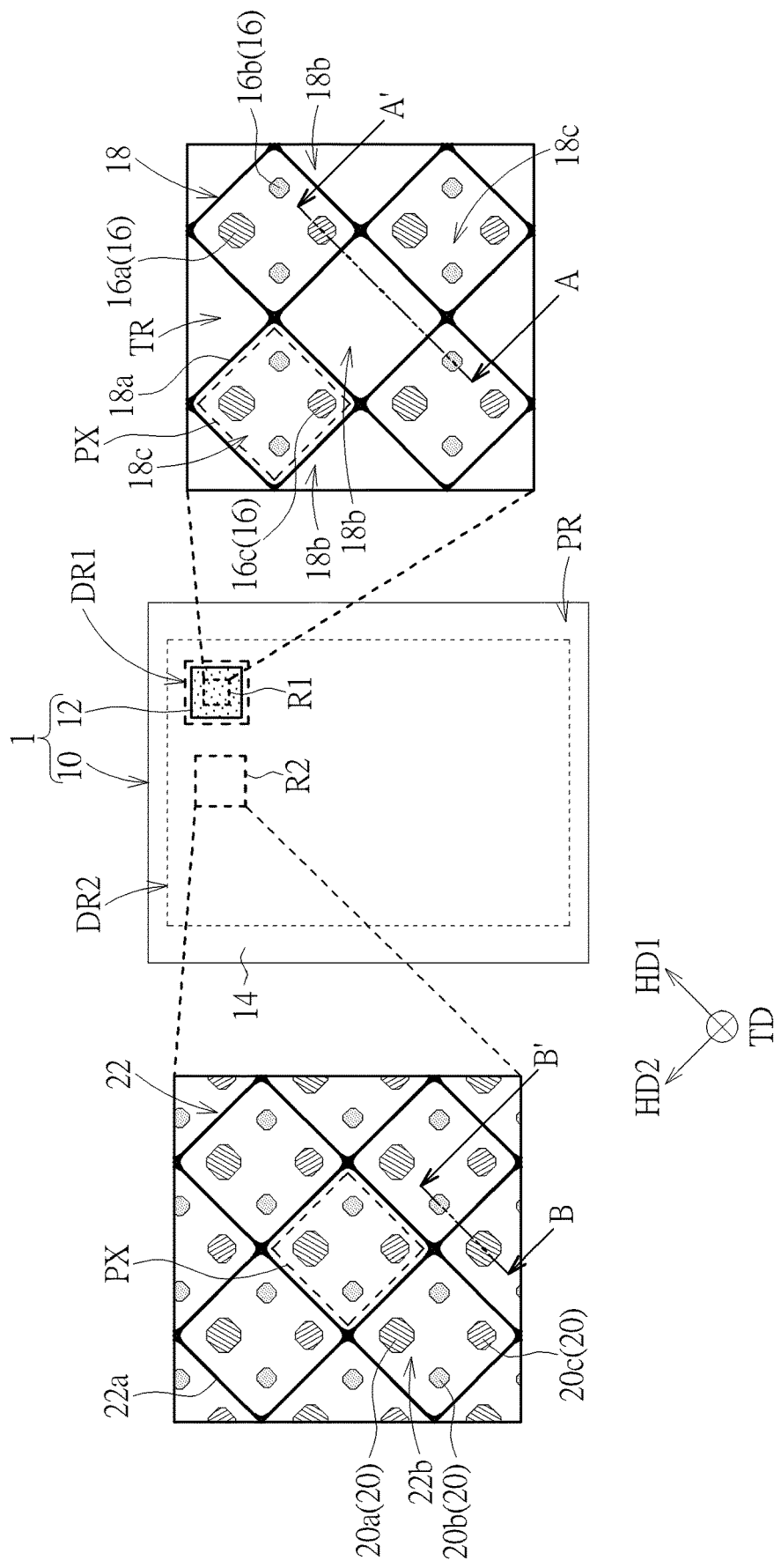
FIG. 1 schematically illustrates a top view of an electronic device according to an embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function. In the following description and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name. Thus, a first element mentioned in the specification may be called a second element.

Spatially relative terms, such as "above", "on", "beneath", "below", "under", "left", "right", "before", "front", "after", "behind" and the like, used in the following embodiments just refer to the directions in the drawings and are not intended to limit the present disclosure. It may be understood that the elements in the drawings may be disposed in any kind of formation known by those skilled in the related art to describe or illustrate the elements in a certain way. Furthermore, when one element is mentioned to overlap another element, it may be understood that the element may partially or completely overlap the another element.

In addition, when one element or layer is "on" or "above" another element or layer, or is connected to another element or layer, it may be understood that the element or layer is directly on the another element or layer, or is directly connected to the another element or layer, and alternatively another element or layer may be between the one element or layer and the another element or layer (indirectly). On the contrary, when the element or layer is "directly on" the another element or layer or is "directly connected to" the another element or layer, there is no intervening element or layer between the element or layer and the another element or layer.

As disclosed herein, the terms "approximately", "about", and "substantially" generally mean within 10%, 5%, 3%, 2%, 1%, or 0.5% of the reported numerical value or range. The quantity disclosed herein is an approximate quantity, that is, without a specific description of "approximately", "about", "substantially", the quantity may still include the meaning of "approximately", "about", and "substantially".

It should be understood that according to the following embodiments, features of different embodiments may be replaced, recombined or mixed to constitute other embodiments without departing from the spirit of the present disclosure. The features of various embodiments may be mixed arbitrarily and used in different embodiments without departing from the spirit of the present disclosure or conflicting.

In the present disclosure, the length, thickness and width may be measured by using an optical microscope, an electron microscope, or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a special definition in the embodiments of the present disclosure.

In the present disclosure, the electronic device may have a display function and may optionally include an optical sensing, image detecting, touching sensing, or antenna function, other suitable functions or any combination thereof, but not limited thereto. In some embodiments, the electronic device may include tiled device, but not limited thereto. The electronic device may include liquid crystal molecule, light-emitting diode (LED), quantum dots material, a fluorescent material, a phosphor material, other suitable materials, or any combination thereof, but not limited thereto. The LED may for example include organic light-emitting diode (OLED), micro light-emitting diode (micro-LED) or mini light-emitting diode (mini-LED), or quantum dot light-emitting diode (e.g., QLED or QDLED), but not limited thereto. In addition, the electronic device may be a color display device or a single color display device. The appearance of the electronic device may be rectangular, circular, polygonal, a shape with curved edges, curved or other suitable shapes, but not limited thereto. The electronic device may optionally have peripheral systems such as a driving system, a control system, a light source system, a shelf system, etc.

Refer to FIG. 1, which schematically illustrates a top view of an electronic device according to an embodiment of the present disclosure. As shown in FIG. 1, the electronic device 1 provided in this embodiment may include a display panel 10 and an optical sensor 12, wherein the display panel 10 may be used for displaying images, and the optical sensor 12 may be used for detecting light. For example, the optical sensor 12 may be used to detect visible light or invisible light. The invisible light may include, for example, infrared light, ultraviolet light, or other suitable light. In some embodiments, the optical sensor 12 may be used to detect images, for example, including an image sensor or a plurality of light sensing units. The image sensor may include, for example, a camera device, but not limited thereto. One of the light sensing units may, for example, include photodiode, phototransistor, or other suitable light sensing element. In some embodiments, the optical sensor 12 may be replaced with elements having other functions.

The display panel 10 is further detailed below. As shown in FIG. 1, the display panel 10 may include a substrate 14, in which the substrate 14 may have a first display region DR1, and the optical sensor 12 may be disposed in the first display region DR1 in a top view direction TD of the display panel 10. In some embodiments, the substrate 14 may optionally have a second display region DR2, but not limited thereto. For example, in the top view direction TD of the display panel 10, the second display region DR2 may surround the first display region DR1 or be disposed on at least one side of the first display region DR1. It should be noted that the first display region DR1 in the following description refers to a region overlapping a sensing region of the optical sensor 12 that is capable of detecting light in the top view direction TD, and the second display region DR2 is located outside the first display region DR1 and overlaps light-emitting units 20 (which will be described in detailed below) in the top view direction TD. In some embodiments, the substrate 14 may optionally have a peripheral region PR disposed outside the first display region DR1 and the second display region DR2 and used for disposing peripheral elements or other suitable elements of the display panel 10, but not limited to this. The substrate 14 may include a transparent substrate, or may include a flexible or rigid substrate. For example, the substrate 14 may include glass, quartz, plastic or other substrates, but not limited thereto.

Figure 5:
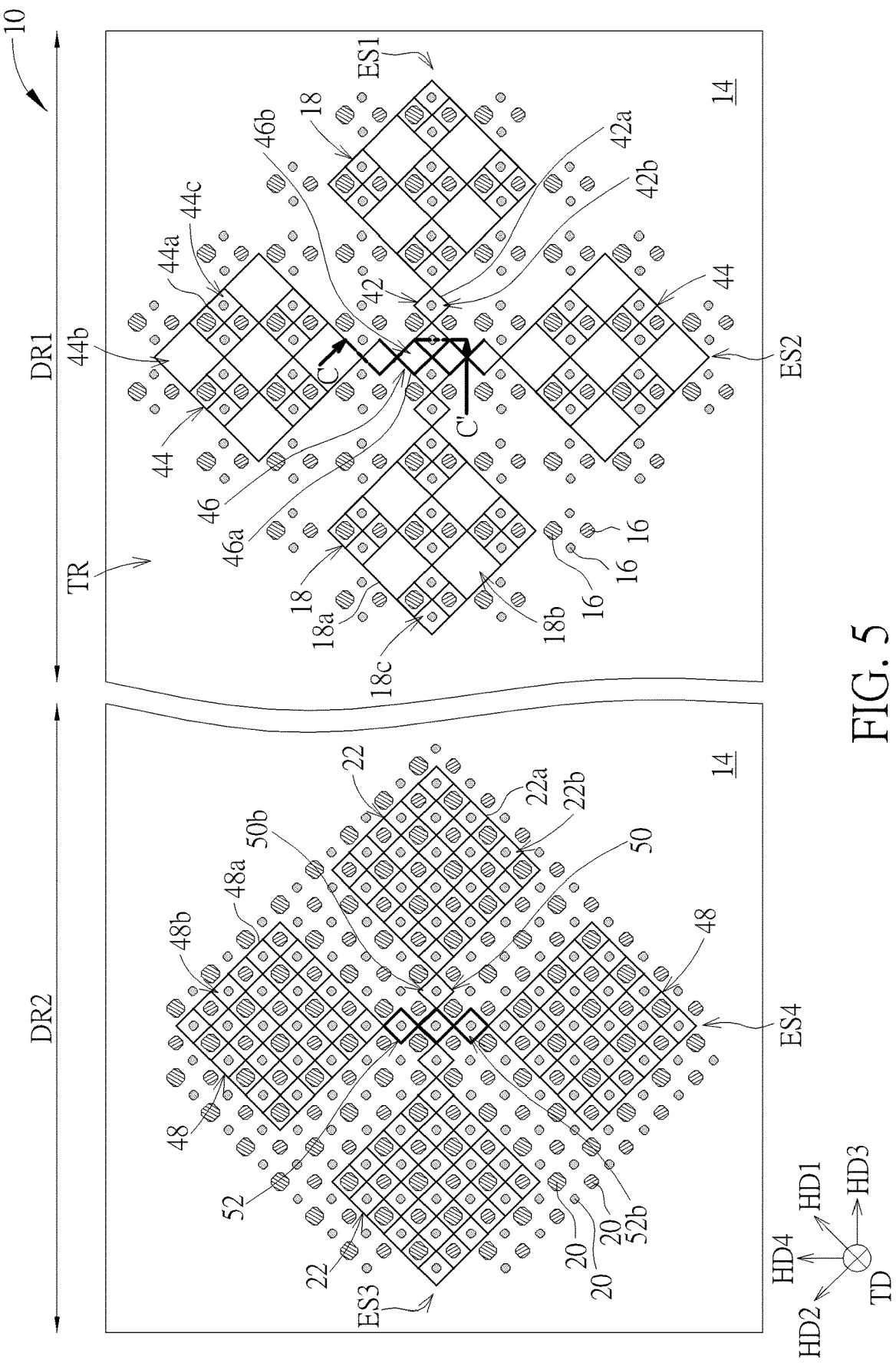
FIG. 5 schematically illustrates top views of the portions of the display panel corresponding to the first display region and the second display region according to some embodiments of the present disclosure.

For convenience of description, FIG. 1 further illustrates an enlarged schematic diagram of a region R1 of the display panel 10 located in the first display region DR1 in the top view direction TD on its right portion, and a structure in the region R1 is as an example to represent a structure of the display panel 10 corresponding to the first display region DR1. FIG. 1 further illustrates another enlarged schematic diagram of a region R2 of the display panel 10 located in the second display region DR2 in the top view direction TD on its left portion, and a structure in the region R2 is as an example to represent a structure of the display panel 10 corresponding to the second display region DR2. The structures of the first display region DR1 and the second display region DR2 of present disclosure are not limited thereto. As shown in the enlarged schematic diagram of the region R1 in FIG. 1, the display panel 10 may further include a plurality of light-emitting units 16 and a plurality of mesh units 18, and the light-emitting units 16 and the mesh units 18 may be disposed in the first display region DR1 in the top view direction TD of the display panel 10. In FIG. 1, one of the mesh units 18 is as an example, but the number of the mesh units 18 of the present disclosure is not limited to this and may be plural, such as shown in FIG. 5. Furthermore, the first display region DR1 may include a transparent area TR, and the light-emitting units 16 are located outside the transparent area TR in the top view direction TD of the display panel 10. It should be noted that, in the present disclosure, the transparent area TR refers to an area outside the light-emitting units 16, and the term "area outside an element" refers to a region that does not overlap the element in the top view direction TD of the display panel 10. In some embodiments, the top view direction TD of the display panel 10 may be, for example, a normal direction of an upper surface of the substrate 14 for disposing the light-emitting units 16 (e.g., the upper surface 14a of the substrate 14 shown in FIG. 2).

Specifically, as shown in the enlarged schematic diagram of the region R1 in FIG. 1, each mesh unit 18 may have a mesh frame 18a, and the mesh frame 18a may form a plurality of mesh openings 18b. It should be noted that the mesh openings 18b do not overlap any light-emitting unit 16 in the top view direction TD of the display panel 10. The transparent area TR may overlap at least one mesh opening 18b in the top-view direction TD of the display panel 10. By doing this, portions of the display panel 10 corresponding to the mesh openings 18b may have higher transmittance, so that the optical sensor 12 corresponding to the first display region DR1 may detect light of higher intensity through the mesh openings 18b, thereby improving the quality of the detected images.

In some embodiments, the mesh frame 18a may further form a plurality of mesh openings 18c, and one of the mesh openings 18c may overlap at least one light-emitting unit 16 or at least one sub-pixel. As shown in FIG. 1, one of the mesh openings 18c may overlap a plurality of light-emitting units 16 or a plurality of sub-pixels in the top view direction TD of the display panel 10. In the embodiment of FIG. 1, the light-emitting units 16 may include a light-emitting unit 16a, a light-emitting unit 16b and a light-emitting unit 16c for generating light of different colors and serving as sub-pixels of different colors, respectively, but not limited thereto. For example, the light-emitting unit 16a, the light-emitting unit 16b, and the light-emitting unit 16c may be used to generate blue, green, and red light, respectively, but not limited thereto. The embodiment of FIG. 1 takes a pixel arrangement of PenTile as an example, so that one pixel PX corresponding to the first display region DR1 may include one light-emitting unit 16a, two light-emitting units 16b, and one light-emitting unit 16c, and one of the mesh openings 18c may overlap to one pixel PX, but not limited to this. In some embodiments, the number, color and arrangement of the light-emitting units 16 for forming the pixel PX may be adjusted according to requirements. In some embodiments, one of the mesh openings 18c may overlap one of the light-emitting units 16 or one of the sub-pixels, e.g., as shown in FIG. 5.

In the embodiment of FIG. 1, the mesh openings 18b and the mesh openings 18c may be alternately arranged along a horizontal direction HD1 and/or another horizontal direction HD2 in sequence. The horizontal direction HD1 is different from the horizontal direction HD2. In one embodiment, the horizontal direction HD1 may be, for example, perpendicular to the horizontal direction HD2 and parallel to an upper surface of the substrate 14 (the upper surface 14a of the substrate 14 shown in FIG. 2), but not limited thereto. In other words, since the mesh openings 18c are openings that overlap the light-emitting units 16, and the mesh openings 18b are openings that do not overlap the light-emitting units 16, the above arrangement of the mesh openings 18b and the mesh openings 18c may increase distances between the pixels PX or sub-pixels, thereby reducing resolution of the portion of the display panel 10 corresponding to the first display region DR1. Accordingly, the area of the transparent area TR of the first display region DR1 may be increased, and/or the transmittance of the display panel 10 corresponding to the first display region DR1 may be improved.

As shown in the enlarged schematic diagram of the region R2 in FIG. 1, the display panel 10 may further include a plurality of light-emitting units 20 and a plurality of mesh units 22, wherein the light-emitting units 20 and the mesh units 22 are disposed in the second display region DR2 in the top view direction TD of the display panel 10. One of the mesh units 22 may include a plurality of mesh openings 22b, and one of the mesh openings 22b may overlap at least one light-emitting unit 20 in the top view direction TD. Specifically, each mesh unit 22 may have a mesh frame 22a, and the mesh frame 22a may form a plurality of mesh openings 22b. One of the mesh openings 22b may overlap at least one of the light-emitting units 20 or at least one sub-pixel. As shown in FIG. 1, one of the mesh openings 22b may overlap a plurality of light-emitting units 20 in the top view direction TD of the display panel 10. In some embodiments, one of the mesh openings 22b may overlap one of the light-emitting units 20 or one sub-pixel, but not limited thereto. In the embodiment of FIG. 1, the light-emitting units 20 may include a light-emitting unit 20a, a light-emitting unit 20b and a light-emitting unit 20c for generating light of different colors and serving as sub-pixels of different colors, respectively, but not limited thereto. For example, the light-emitting unit 20a, the light-emitting unit 20b, and the light-emitting unit 20c may be the same as the light-emitting unit 16a, the light-emitting unit 16b, and the light-emitting unit 16c, respectively, but not limited thereto. The arrangement of the light-emitting unit 20a, the light-emitting unit 20b, and the light-emitting unit 20c may be, for example, the same as the arrangement of the light-emitting unit 16a, the light-emitting unit 16b, and the light-emitting unit 16c, but not limited thereto. One of the pixels PX corresponding to the second display region DR2 may include one light-emitting unit 20a, two light-emitting units 20b, and one light-emitting unit 20c. The arrangement of the pixels PX may include, for example, the arrangement of PenTile or other suitable arrangements. It should be noted that, mesh openings without overlapping the light-emitting units 20 may not exist between any two adjacent mesh openings 22b. In other words, resolution of a portion of the display panel 10 corresponding to the second display region DR2 may be greater than the resolution of the portion of the display panel 10 corresponding to the first display region DR1. The resolution of the portion of the display panel 10 corresponding to the first display region DR1 may be, for example, half of the resolution of the portion of the display panel 10 corresponding to the second display region DR2.

As shown in FIG. 1, the mesh frame 18a and the mesh frame 22a may have conductive property, so that the mesh units 18 and the mesh units 22 may respectively be used as sensing electrodes of a touch sensing device. For example, the mesh frame 18a and the mesh frame 22a may include a metal material, in which the metal material includes, for example, molybdenum, aluminum, or copper. The mesh frame 18a and the mesh frame 22a may be, for example, formed of the same metal layer, but not limited thereto. The mesh frame 18a and the mesh frame 22a may be, for example, a single-layer or multilayer structure. When the mesh frame 18a and the mesh frame 22a are the multilayer structure, the mesh frame 18a and the mesh frame 22a may, for example, include a stacked structure of molybdenum/aluminum/molybdenum or molybdenum/copper/molybdenum.

Figure 2:
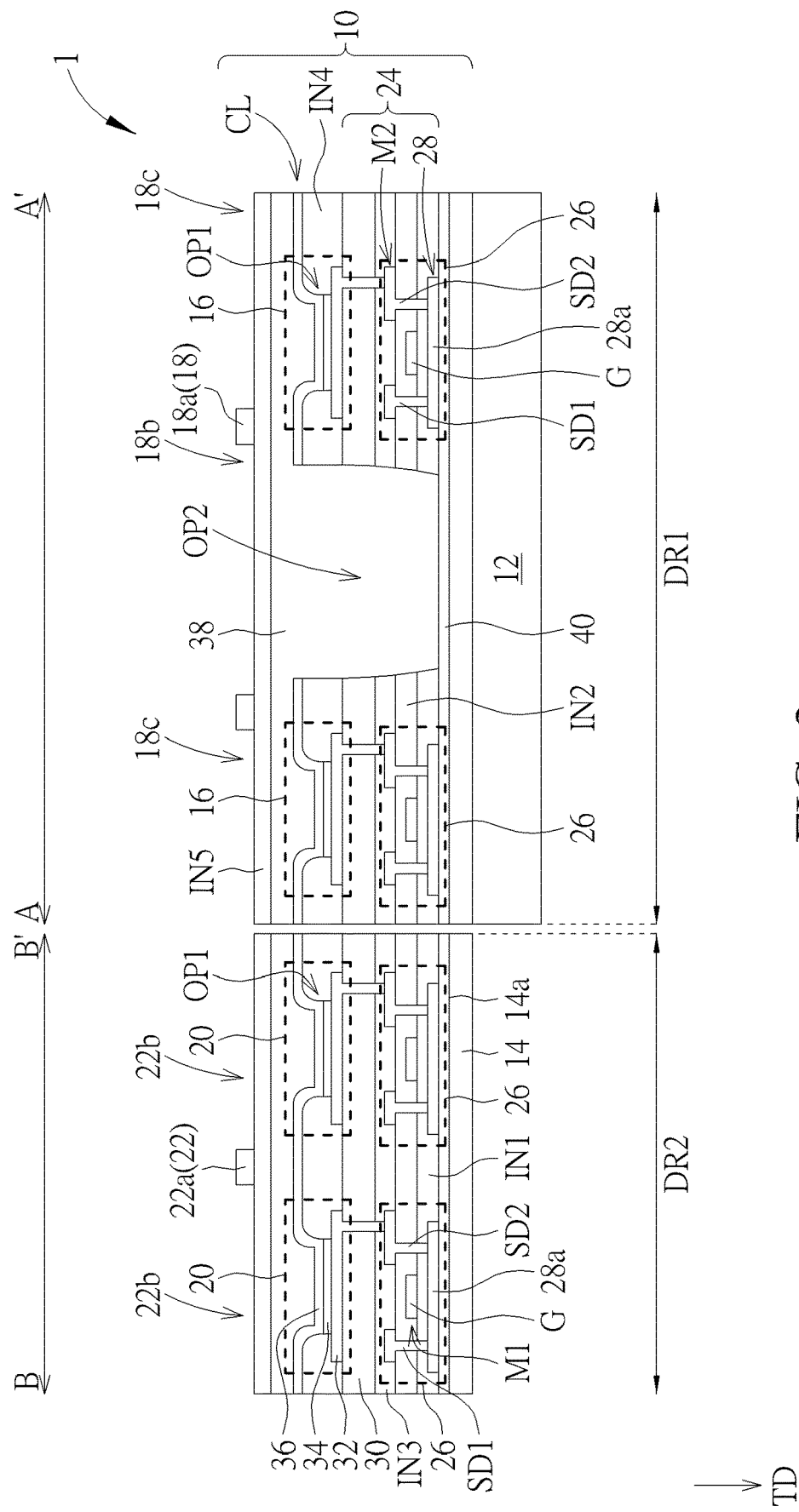
FIG. 2 schematically illustrates cross-sectional views of the electronic device respectively taken along a line A-A' and a line B-B' of FIG. 1 according to an embodiment of the present disclosure.

FIG. 2 schematically illustrates cross-sectional views of the electronic device respectively taken along a line A-A' and a line B-B' of FIG. 1 according to an embodiment of the present disclosure. The schematic cross-sectional views shown in FIG. 2 are as an example of the electronic device 1 in FIG. 1, and the schematic cross-sectional views of the electronic device in FIG. 1 are not limited to the structure shown in FIG. 2 and may be adjusted according to types of the display panel and the touch sensing device. As shown in FIG. 2, the optical sensor 12 may be disposed under the first display region DR1 of the substrate 14, but not limited thereto. In addition, the display panel 10 may include a circuit layer 24 disposed between the light-emitting units 16 and the substrate 14 and between the light-emitting units 20 and the substrate 14. For example, the circuit layer 24 may include a plurality of driving elements 26 for driving the light-emitting units 16 and the light-emitting units 20 to generate light. The driving elements 26 may include, for example, thin film transistors or other suitable transistors, but not limited thereto. In some embodiments, the circuit layer 24 may include switching elements (not shown), signal lines (not shown) and other suitable elements in addition to the driving elements 26. The signal lines may include, for example, data lines, scan lines, common lines or other required signal lines.

In the embodiment of FIG. 2, the driving elements 26 and the switching elements may be, for example, top-gate type thin film transistors, and in this case, the circuit layer 24 may include a semiconductor layer 28, an insulating layer IN1, and a metal layer M1, an insulating layer IN2, a metal layer M2, an insulating layer IN3, and a planarization layer 30. The semiconductor layer 28 is disposed on the substrate 14 and may include a plurality of semiconductor blocks 28a serving as channel layers of the driving elements 26. The insulating layer IN1 may be disposed on the semiconductor layer 28 and serve as a gate insulating layer of the driving elements 26. The metal layer M1 may be disposed on the insulating layer IN1 and may include a plurality of gates G of the driving elements 26 respectively disposed on the corresponding semiconductor blocks 28a. The insulating layer IN2 may be disposed on the metal layer M1, and the insulating layer IN1 and the insulating layer IN2 may have a plurality of through holes. The metal layer M2 is disposed on the insulating layer IN2 and includes source (drain) electrodes SD1 of the driving elements 26 and drain (source) electrodes SD2 of the driving elements 26, and the source (drain) electrodes SD1 and the drain (source) electrodes S2 may be electrically connected to the corresponding semiconductor blocks 28a through the through holes of the insulating layer IN2 and the insulating layer IN1, respectively. The insulating layer IN3 and the planarization layer 30 may be sequentially disposed on the metal layer M2 and have a plurality of through holes. The light-emitting units 16 and the light-emitting units 20 may be electrically connected to the corresponding driving elements 26 through the through holes of the planarization layer 30 and the insulating layer IN3, respectively. The metal layer M1 and the metal layer M2 may, for example, include aluminum, molybdenum nitride, copper, titanium, other suitable materials, or a combination thereof, but not limited thereto. The structure of the circuit layer 24 of the present disclosure is not limited to this and may be adjusted according to the types of the driving elements 26 and the switching elements. In some embodiments, the driving elements 26 and the switching elements may be, for example, bottom-gate thin film transistors, or may be altered to be double gate transistors or other suitable transistors based on requirements.

As shown in FIG. 2, the display panel 10 may further include an insulating layer IN4 disposed on the circuit layer 24, in which the insulating layer IN4 may include a plurality of openings OP1, and the light-emitting units 16 and the light-emitting units 20 may be disposed corresponding to the openings OP1, respectively. In the embodiment of FIG. 2, the light-emitting units 16 and the light-emitting units 20 may include organic light-emitting diodes as an example. In this case, each of the light-emitting units 16 and the light-emitting units 20 may include a first electrode 32, a light-emitting layer 34, and a second electrode 36. The first electrodes 32 may be disposed on the planarization layer 30 and spaced apart from each other. The insulating layer IN4 may be disposed on the first electrodes 32 and the planarization layer 30, and each of the first electrodes 32 may be exposed by the corresponding opening OP1. Also, each light-emitting layer 34 may be disposed in the corresponding opening OP1 of the insulating layer IN4, and each second electrode 36 may be disposed on the corresponding light-emitting layer 34 and extend to be on the insulating layer IN4. In the embodiment of FIG. 2, the second electrodes 36 of the light-emitting units 16 and the light-emitting units 20 may be formed of the same conductive layer CL, but not limited thereto. The first electrode 32 and the second electrode 36 may be, for example, an anode and a cathode of the organic light-emitting diode, respectively, but not limited thereto, and they may be interchanged with each other. It should be noted that a region of one of the light-emitting units 16 and the light-emitting units 20 may, for example, be defined as a region where the first electrode 32, the light-emitting layer 34 and the second electrode 36 overlap each other in the top view direction TD. The light-emitting units 16 and the light-emitting units 20 of the present disclosure are not limited thereto. In some embodiments, the light-emitting units 16 and the light-emitting units 20 may, for example, include LEDs, in which the LEDs may be, for example, LED chips or LED package structures. In this case, the region of one of the light-emitting units 16 and the light-emitting units 20 may be defined as the region of the LED. In some embodiments, the insulating layer IN4 may include, for example, an organic material or other suitable material, but not limited thereto.

As shown in FIG. 2, the display panel 10 may further include a sealing layer 38 disposed on the light-emitting units 16 and the light-emitting units 20 to protect the light-emitting units 16 and the light-emitting units 20. The sealing layer 38 may be a single-layer or multilayer structure, in which the multilayer structure may be, for example, a three-layer structure (e.g., a bottom inorganic layer, a middle organic layer, and a top inorganic layer), but not limited thereto. In some embodiments, the sealing layer 38 in the transparent area TR and the sealing layer 38 on the light-emitting units 16 and the light-emitting units 20 may be composed of different structures or materials. In some embodiments, the display panel 10 may optionally further include an insulating layer IN5 disposed on the sealing layer 38, but not limited thereto. The mesh frame 18a of the mesh unit 18 and the mesh frame 22a of the mesh unit 20 may be disposed on the insulating layer IN5, and in the top view direction TD, the mesh frame 18a and the mesh frame 22a may overlap the insulating layer IN4. In some embodiments, the insulating layer IN1, the insulating layer IN2, the insulating layer IN3, and the insulating layer IN5 may include silicon oxide, silicon nitride, other suitable materials, or a combination thereof, but not limited thereto.

In the embodiment of FIG. 2, the second electrode 36, the insulating layer IN4 and the circuit layer 24 may have a plurality of openings OP2, and the sealing layer 38 may be disposed in the openings OP2. The openings OP2 may improve the transmittance of portions of the display panel 10 corresponding to the openings OP2. Specifically, each opening OP2 may overlap a corresponding one of the mesh openings 18b in the top view direction TD. In some embodiments, one of the openings OP2 may not penetrate through the circuit layer 24, and a depth of one of the openings OP2 in the top view direction TD may be adjusted according to requirements. In some embodiments, the second electrode 36, the insulating layer IN4 and the circuit layer 24 may not have the openings OP2. In some embodiments, the sealing layer 38 in the openings OP2 and the sealing layer 38 on the light-emitting units 16 and the light-emitting units 20 may be composed of different structures or materials.

In some embodiments, as shown in FIG. 2, the display panel 10 may optionally include a buffer layer 40 disposed between the substrate 14 and the circuit layer 24. The buffer layer 40 may, for example, be used to block moisture, oxygen, or ions from entering the circuit layer 24. The buffer layer 40 may be a single-layer or multilayer structure, and a material of the buffer layer 40 may include, for example, silicon nitride, silicon oxide, silicon oxynitride, aluminum oxide, resin, other suitable materials, or a combination thereof, but not limited thereto.

Figure 3:
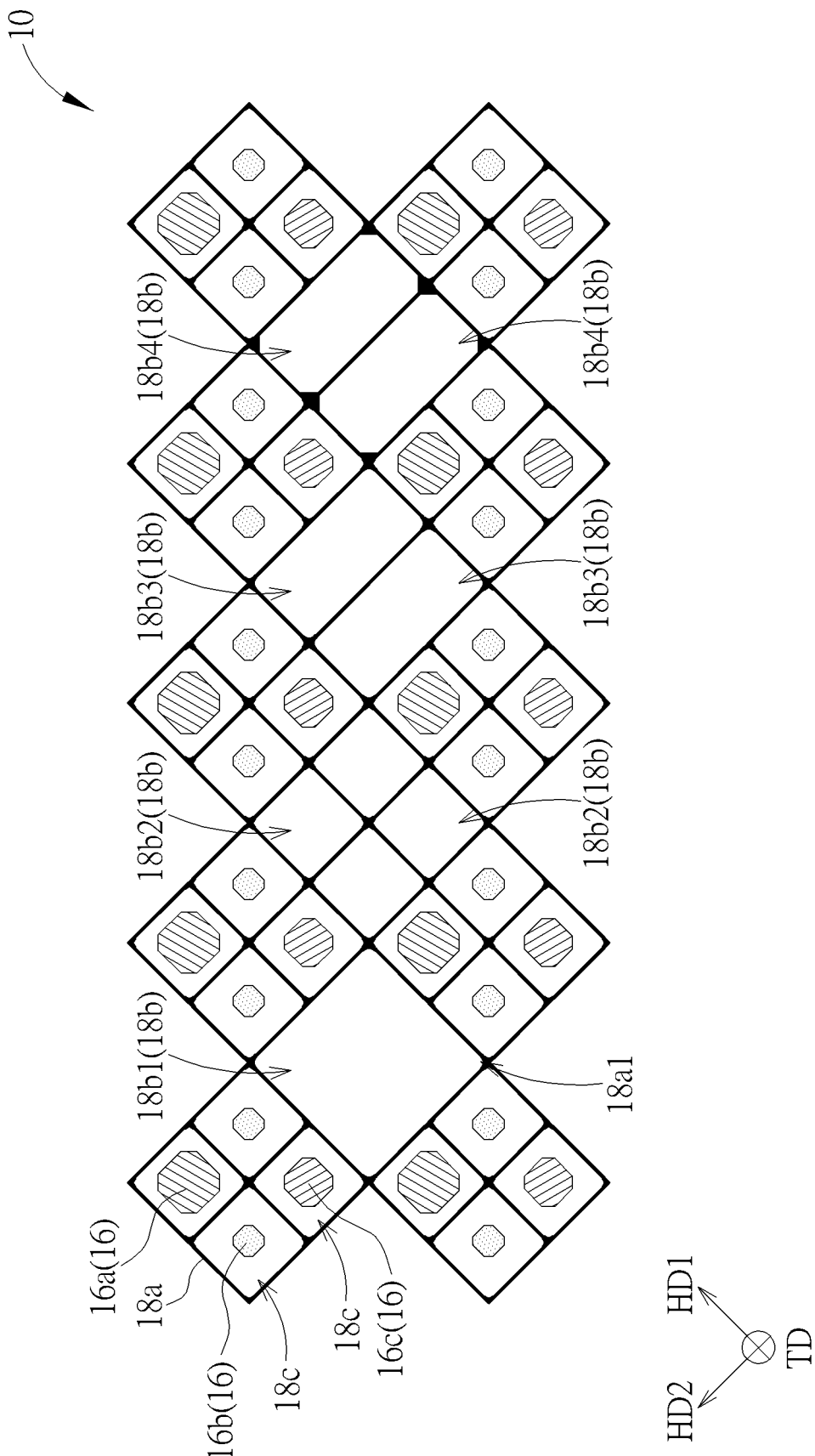
FIG. 3 schematically illustrates a top view of a portion of the display panel corresponding to the first display region according to some embodiments of the present disclosure.

FIG. 3 schematically illustrates a top view of a portion of the display panel corresponding to the first display region according to some embodiments of the present disclosure. As shown in FIG. 3, in some embodiments, one of the mesh openings 18c may overlap one of the light-emitting units 16, but not limited thereto. In some embodiments, the corresponding relationship between the mesh openings 18c and the light-emitting units 16 shown in FIG. 3 may be adapted to the above-mentioned corresponding relationship between the mesh openings 18c and the light-emitting units 16 and/or corresponding relationship between the mesh openings 22b and the light-emitting units 20 in FIG. 1.

In some embodiments, as shown in FIG. 3, the mesh frame 18a may have an outline in the top view direction TD of the display panel 10, and a portion 18a1 of the outline may be curved or arc-shaped. For example, the portion 18a1 of the outline may be located at a corner of a mesh opening 18b1 of the mesh openings 18b. In some embodiments, at least one of the mesh openings 18b and/or at least one of the mesh openings 18c of at least one mesh frame 18a and/or at least one of the mesh openings 22b of at least one mesh frame 22a may have curved or arc-shaped outline, but not limited thereto. In some embodiments, at least one mesh opening 18b4 of the mesh frame 18a may have a polygonal shape (not including curved or arc-shaped outline) in the top view direction TD, and for example, an angle between any two sides of the mesh opening 18b4 connected to each other may be greater than 90 degrees, but not limited thereto. In some embodiments, at least one of the mesh openings 18b and/or at least one of the mesh openings 18c of at least one mesh frame 18a and/or at least one of the mesh openings 22b of at least one mesh frame 22a may be polygonal, but not limited thereto. In some embodiments, the curved or arc-shaped outline and/or polygonal mesh opening 18b may be adapted to the mesh openings 18b, the mesh openings 18c, and/or the mesh openings 22b of the above-described embodiments and/or at least one mesh opening in the following contents.

In some embodiments, as shown in FIG. 3, sizes of the mesh openings 18b may be adjusted according to requirements. For example, in the same unit area, the number of the mesh opening 18b1, the number of the mesh openings 18b2, and the number of mesh openings 18b3 may be different from each other. In other words, in the same unit area, an overlapping area of a portion of the mesh frame 18a corresponding to the mesh opening 18b1 and the transparent area TR, an overlapping area of another portion of the mesh frame 18a corresponding to one of the mesh openings 18b2 and the transparent area TR, and an overlapping area of another portion of the mesh frame 18a corresponding to one of the mesh openings 18b3 and the transparent area TR may be different from each other to adjust the transmittance of the display panel 10. For example, the number of the mesh openings 18b located between two adjacent pixels arranged along the horizontal direction HD1 or the horizontal direction HD2 may be at least one.

Figure 4:
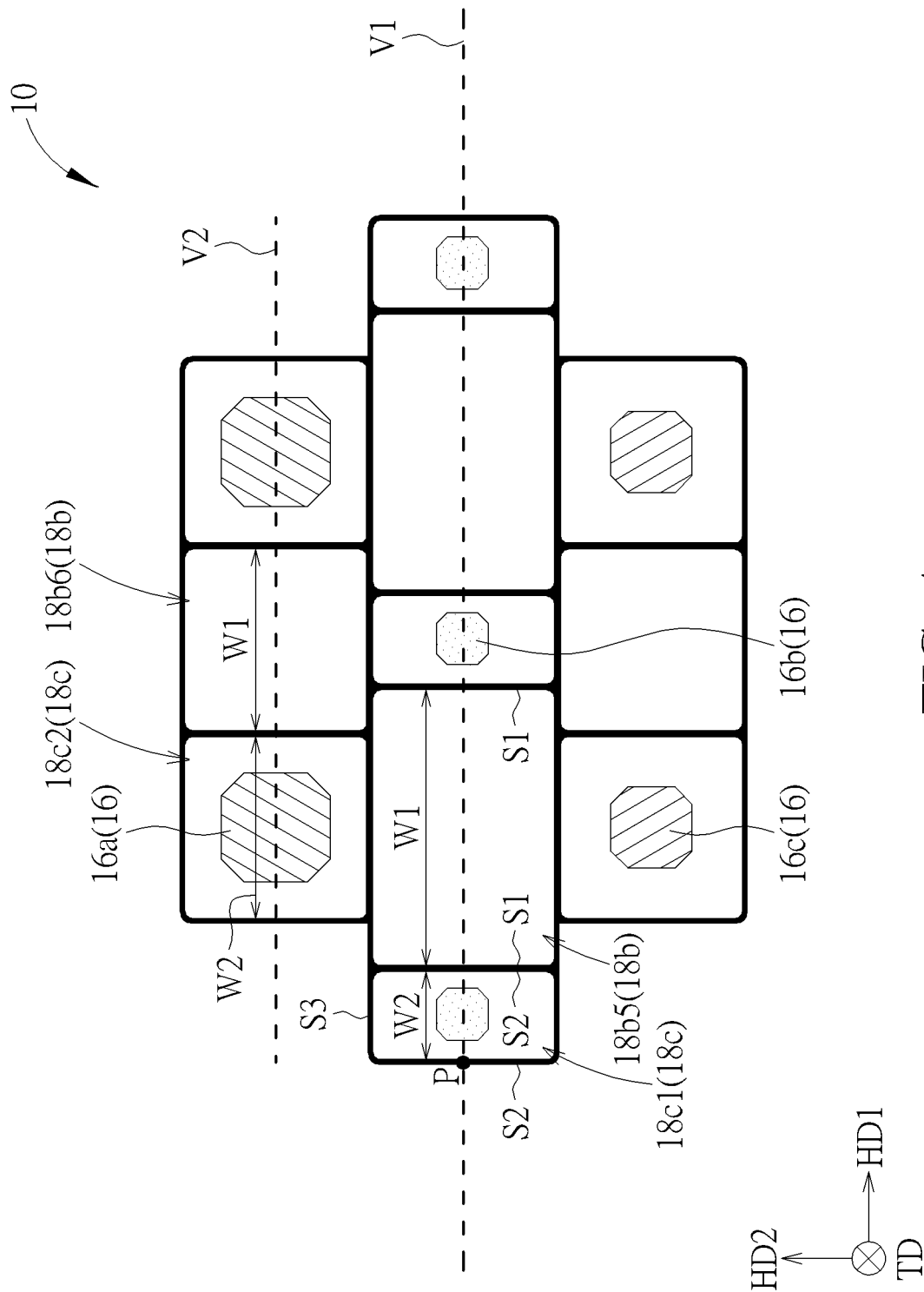
FIG. 4 schematically illustrates a top view of a portion of the display panel corresponding to the first display region according to some embodiments of the present disclosure.

FIG. 4 schematically illustrates a top view of a portion of the display panel corresponding to the first display region according to some embodiments of the present disclosure. As shown in FIG. 4, a width W1 of one of the mesh openings 18b and a width W2 of one of the mesh openings 18c may be the same or different. For example, a ratio of the width W1 of one of the mesh openings 18b to the width W2 of one of the mesh openings 18c may be greater than or equal to 1.01 and less than or equal to 5 ($1.01 \leq W1/W2 \leq 5$), or may be greater than or equal to 1.01 and less than or equal to 3 ($1.01 \leq W1/W2 \leq 3$). It should be noted that, the width W1 of the mesh opening 18b and the width W2 of the mesh opening 18c may be obtained by the following method. The mesh opening 18b5 and the mesh opening 18c1 are as an example, and a virtual line V1 extending along an arrangement direction of the mesh opening 18b5 and the mesh opening 18c1 (e.g., the horizontal direction HD1) is located first, in which the virtual line V1 crosses two opposite sides S1 of the mesh opening 18b5 and two opposite sides S2 of the mesh opening 18c1. Then, a center point P of one of the sides S1 of the mesh opening 18b5 and the sides S2 of the mesh opening 18c1 may be obtained. One of the sides S2 of the mesh opening 18c1 is as an example, and a point at half of length of the side S2 may be obtained, which is the center point P. Then, the virtual line V1 is set to pass through the center point P. In this case, the length of the virtual line V1 crossing the mesh opening 18b5 is measured to obtain the width W1 of the mesh opening 18b5, and the virtual line V1 crossing the mesh opening 18c1 is measured to obtain the width W2 of the mesh opening 18c1. When the width W1 of the mesh opening 18b5 is different from the width W2 of the mesh opening 18c1, although the positions of the virtual line V1 crossing the sides S1 and the sides S2 may be different during different measurements, all the calculated ratios of the width W1 of the mesh opening 18b5 to the width W2 of the mesh opening 18c1 in different cases may be within the above-mentioned ratio range.

In some embodiments, as shown in FIG. 4, when the width W1 of the mesh opening 18b5 is different from the width W2 of the mesh opening 18c1, the width W1 of another mesh opening 18b6 may be the same as the width W2 of another mesh opening 18c2. The width W1 of the mesh opening 18b6 and the width W2 of the mesh opening 18c2 may be obtained, for example, through a virtual line V2, but not limited thereto. In some embodiments, as shown in FIG. 1, the width W1 of each mesh opening 18b may be the same as the width W2 of each mesh opening 18c. In some embodiments, the width W1 of each mesh opening 18b may be different from the width W2 of each mesh opening 18c, but the present disclosure is not limited thereto.

Figure 6:
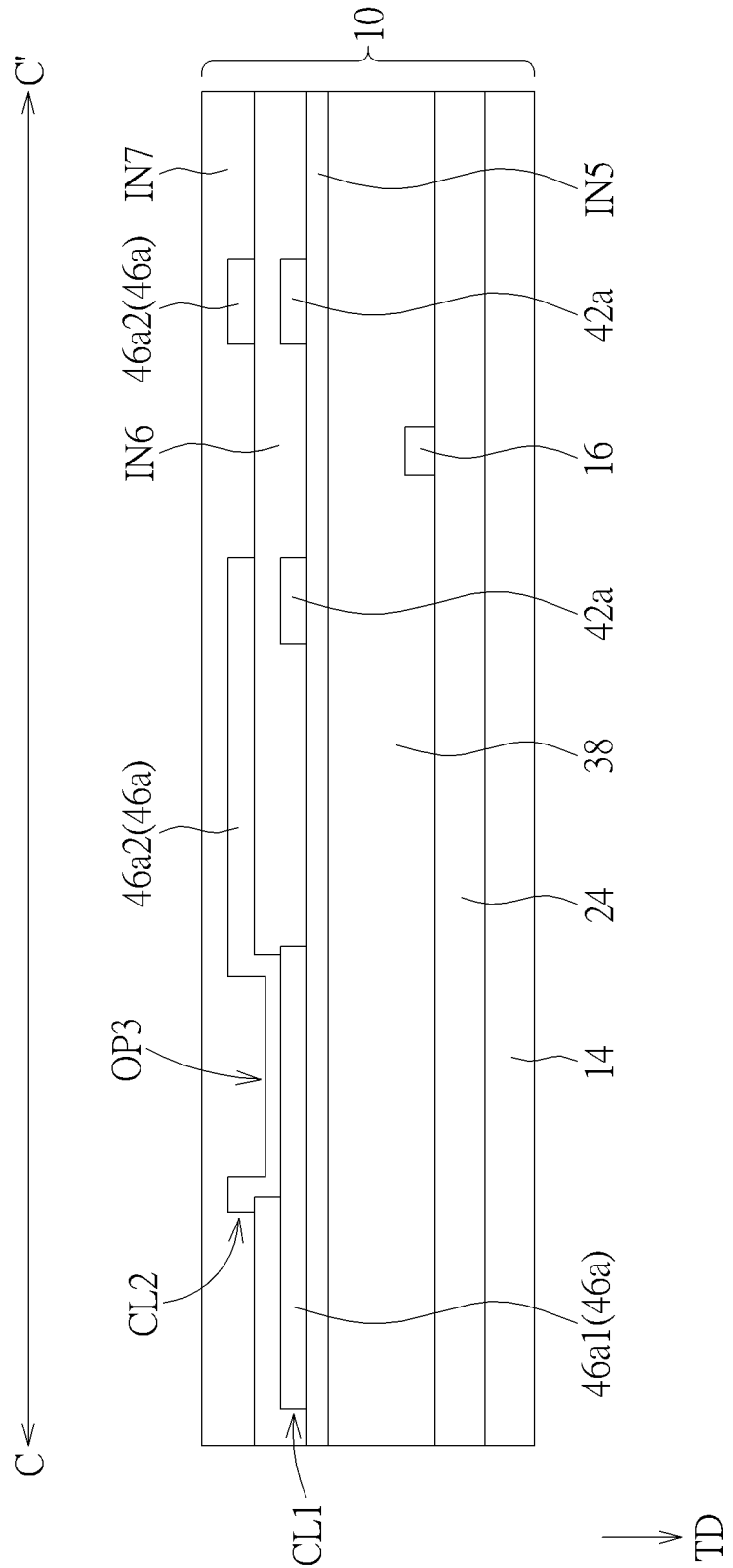
FIG. 6 schematically illustrates a cross-sectional view of the display panel taken along a line C-C' of FIG. 5.

FIG. 5 schematically illustrates top views of the portions of the display panel corresponding to the first display region and the second display region according to some embodiments of the present disclosure, and FIG. 6 schematically illustrates a cross-sectional view of the display panel taken along a line C-C' of FIG. 5. As shown in FIG. 5, the display panel 10 may include a plurality of mesh units 18. The mesh units 18 may be arranged, for example, in the horizontal direction HD3. The display panel 10 may further include a plurality of bridge units 42, in which each bridge unit 42 is disposed between two adjacent mesh units 18 and used for electrically connecting these two adjacent mesh units 18 to each other. The mesh units 18 and the bridge units 42 may be electrically connected to form a plurality of electrode strings ES1 electrically insulated from each other, in which the electrode strings ES1 may, for example, extend along the horizontal direction HD3. In the embodiment of FIG. 5, one of the bridge units 42 may have a strip-shaped mesh 42a, and the strip-shaped mesh 42a may include a plurality of mesh openings 42b. The mesh openings 42b may be arranged along the horizontal direction HD3 and overlap at least one light-emitting unit 16 in the top view direction TD. The number and size of the mesh openings 42b may be adjusted according to the distance between two adjacent mesh units 18.

As shown in FIG. 5, the display panel 10 may further include a plurality of mesh units 44 disposed on the first display region DR1 of the substrate 14, in which the mesh units 44 and the mesh units 18 may be arranged in different directions. For example, when the mesh units 18 are arranged along the horizontal direction HD3, the mesh units 44 may be arranged along the horizontal direction HD4, but not limited thereto. The horizontal direction HD3 may be different from the horizontal direction HD4. For example, the horizontal direction HD3 may be perpendicular to the horizontal direction HD4, but not limited thereto. In the embodiment of FIG. 5, the horizontal direction HD3 and the horizontal direction HD4 may be different from the arrangement direction of the mesh openings 18b and the arrangement direction of the mesh openings 18c (e.g., the horizontal direction HD1 or the horizontal direction HD2), but not limited thereto. In addition, each mesh unit 44 may have a mesh frame 44a, and each mesh frame 44a may form a plurality of mesh openings 44b and a plurality of mesh openings 44c, in which the mesh openings 44b may overlap the transparent area TR in the top view direction TD, and one of the mesh openings 44c may overlap at least one light-emitting unit 16 or one sub-pixel in the top view direction TD, but not limited thereto. In some embodiments, one of mesh openings 44b may adopt any one of the mesh openings 18b in any one of the embodiments mentioned above or the embodiments in the following contents, and one of mesh openings 44c may adopt any one of the mesh openings 18c in any one of the embodiments mentioned above or the embodiments in the following contents, so they are not detailed redundantly. In some embodiments, taking one of the mesh units 18 and one of the mesh units 44 as an example, the mesh openings 18b and the mesh openings 44b may be different in numbers, and/or the mesh openings 18c and the mesh openings 44c may be different in numbers. In some embodiments, one of the mesh units 18 and one of the mesh units 44 may be different in mesh pattern.

As shown in FIG. 5, the display panel 10 may further include a plurality of bridge units 46, in which each bridge unit 46 is disposed between two adjacent mesh units 44 and used for electrically connecting these two adjacent mesh units 44 to each other. The mesh units 44 and the bridge units 46 may be electrically connected to form a plurality of electrode strings ES2 electrically insulated from each other, in which the electrode strings ES2 may extend along the horizontal direction HD4, and the electrode strings ES2 may overlap the electrode strings ES1 in the top view direction TD. In the embodiment of FIG. 5, one of the bridge units 46 may have a strip-shaped mesh 46a, and the strip-shaped mesh 46a may include a plurality of mesh openings 46b. In some embodiments, one of the mesh openings 46b may overlap at least one of the light-emitting units 16 in the top view direction TD, but not limited thereto. For example, the mesh openings 46b may be arranged along the horizontal direction HD4, but not limited thereto. It should be noted that one of the bridging units 46 may overlap one of the bridging units 42 in the top view direction TD, and a dielectric layer (e.g., the insulating layer IN6 shown in FIG. 6) may be disposed between the bridging unit 46 and the bridging unit 42 to electrically insulate the bridge unit 42 from the bridge unit 46. Therefore, the electrode strings ES2 may have capacitive coupling with the electrode string ES1, thereby forming a touch sensing device corresponding to the first display region DR1.

Specifically, as shown in FIG. 6, the display panel 10 may include an insulating layer IN6 and an insulating layer IN7 sequentially disposed on the insulating layer IN5, and the strip-shaped mesh 46a of the bridge unit 46 may include a first layer 46a1 and a second layer 46a2. In the embodiment of FIG. 6, the first layer 46a1 and the strip-shaped mesh 42a may be disposed on the insulating layer IN5 and may be separated from each other, such that the first layer 46a1 and the strip-shaped mesh 42a may be electrically insulated from each other. For example, the first layer 46a1 and the strip-shaped mesh 42a may include the same conductive material or be formed of the same conductive layer CL1. The insulating layer IN6 may be disposed on the first layer 46a1 and the strip-shaped mesh 42a, and the insulating layer IN6 may have an opening OP3 (or a through hole) exposing a part of the first layer 46a1. The second layer 46a2 may be disposed on the insulating layer IN6 and extend through the opening OP3 to contact (or be electrically connected to) the first layer 46a1. The second layer 46a2 may be formed of, for example, the conductive layer CL2. Since the strip-shaped mesh 42a is disposed between the insulating layer IN5 and the insulating layer IN6, the second layer 46a2 disposed on the insulating layer IN6 may overlap the strip-shaped mesh 42a in the top view direction TD and electrically connect the adjacent mesh units 44 to each other. In some embodiments, the insulating layer IN6 and the insulating layer IN7 may include, for example, silicon oxide, silicon nitride, other suitable materials, a combination thereof, but not limited thereto. The structures of the strip-shaped mesh 42a and the strip-shaped mesh 46a of the present disclosure are not limited to the mentioned above. In some embodiments, the strip-shaped mesh 42a and the second layer 46a2 of the striped mesh 46a may include the same conductive material or different conductive materials. In some embodiments, the second layer 46a2 may be formed of the conductive layer CL1, and the first layer 46a1 and the strip-shaped mesh 42a may be formed of the conductive layer CL2. In other words, the first layer 46a1 may be disposed on the second layer 46a2, and the present disclosure is not limited thereto.

Refer to the second display region DR2 in FIG. 5 again. The display panel 10 may further include a plurality of mesh units 48 disposed on the second display region DR2 of the substrate 14. The mesh unit 48 may have a mesh frame 48a, and the mesh frame 48a may form a plurality of mesh openings 48b, in which one of the mesh openings 48b may overlap at least one light-emitting unit 20 in the top view direction TD. In the embodiment of FIG. 5, the mesh unit 48 and the mesh unit 22 may, for example, have the same mesh pattern, but not limited thereto.

In addition, as shown in FIG. 5, the display panel 10 may further include a plurality of bridge units 50 and a plurality of bridge units 52. The bridge units 50 may be electrically connected to adjacent mesh units 22, such that the mesh units 22 and the bridge units 50 may form a plurality of electrode strings ES3 electrically insulated from each other. The bridge units 52 may be electrically connected to adjacent mesh units 48, such that the mesh units 48 and the bridge units 52 may form a plurality of electrode strings ES4 electrically insulated from each other, and the electrode strings ES4 may overlap the electrode strings ES3 in the top view direction TD. The electrode strings ES3 may have capacitive coupling with the electrode strings ES4, thereby forming a touch sensing device corresponding to the second display region DR2. Therefore, the touch sensing device may be, for example, a mutual capacitance type, but not limited thereto. It should be noted that, in FIG. 5 and following FIG. 7, FIG. 8, and FIG. 10, in order to clearly show the bridge units 46 and the bridge units 52, the frame lines of the bridge units 46 and the bridge units 52 are drawn to be thicker than the frame lines of the bridge units 42 and the bridge units 50, but the present disclosure is not limited to this.

In the embodiment of FIG. 5, the electrode strings ES3 and the electrode strings ES4 extend along different directions respectively, for example, extend along the horizontal direction HD3 and the horizontal direction HD4 respectively. One of the bridge units 50 may include a plurality of mesh openings 50b, and each mesh opening 50b may overlap at least one light-emitting unit 20 in the top view direction TD. The mesh openings 50b may be arranged along the horizontal direction HD3, but not limited thereto. One of the bridge units 52 may include a plurality of mesh openings 52b, and each mesh opening 52b may overlap at least one light-emitting unit 20 in the top view direction TD. The mesh openings 52b may be arranged along the horizontal direction HD4, but not limited thereto. In the embodiment of FIG. 5, a size of one of the mesh openings 50b may be the same as a size of one of the mesh openings 52b, but not limited thereto. According to the requirements of the distances between the adjacent mesh units 22 and the distances between the adjacent mesh units 48, the number of the mesh openings 50b of one of the bridging units 50 may be different from the number of the mesh openings 42b of one of the bridging units 42, and/or the number of mesh openings 52b of the bridge unit 52 may be different from the number of mesh openings 46b of the bridge unit 46, but not limited thereto. In some embodiments, when one of the electrode strings ES3 and a corresponding one of the electrode strings ES1 are arranged along the same line, this electrode string ES3 and the corresponding electrode string ES1 may be electrically connected to each other. Similarly, when one of the electrode strings ES4 and a corresponding one of the electrode strings ES2 are arranged along the same line, this electrode string ES4 and the corresponding electrode string ES2 may be electrically connected to each other.

Figure 7:
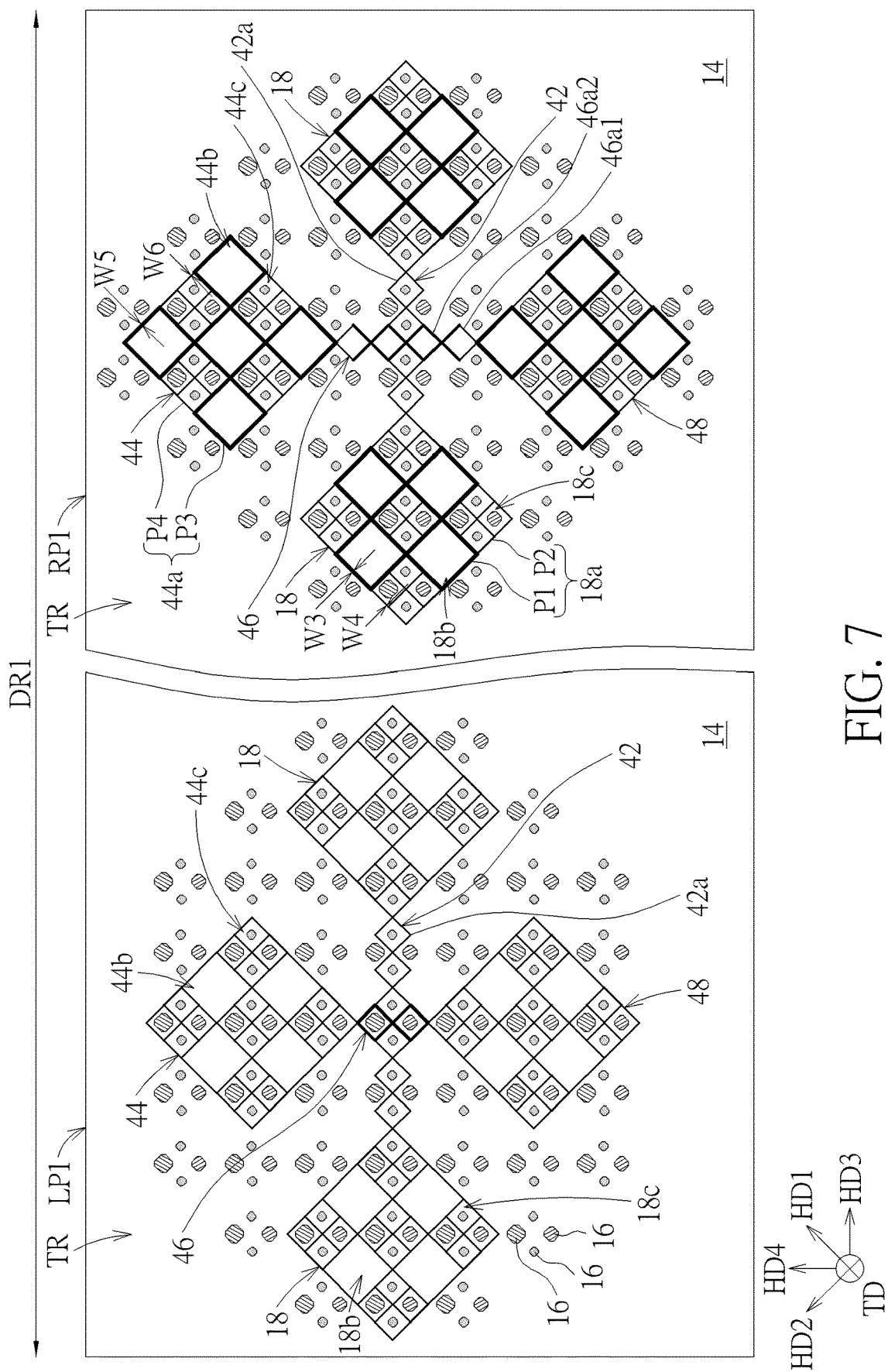
FIG. 7 schematically illustrates top views of different portions of the display panel corresponding to the first display region according to some embodiments of the present disclosure.

FIG. 7 schematically illustrates top views of different portions of the display panel corresponding to the first display region according to some embodiments of the present disclosure. As shown in a left portion LP1 of FIG. 7, the mesh openings 18b of one of the mesh units 18 and the mesh openings 44b of one of the mesh units 44 may have the same number. For example, one of the mesh units 18 and one of the mesh units 44 may have the same or similar mesh pattern. In this case, since the mesh openings 18b of the mesh unit 18 and the mesh openings 44b of the mesh unit 44 need to match the design of the light-emitting units 16 in the top view direction TD, the distance between adjacent two of the mesh units 18 may be different from the distance between adjacent two of the mesh units 44, but not limited thereto.

As shown in a right portion RP1 of FIG. 7, the mesh frame 18a of one of the mesh units 18 may have a portion P1 corresponding to one of the mesh openings 18b and a portion P2 corresponding to one of the mesh openings 18c, and a width W3 of the portion P1 may be greater than a width W4 of the portion P2. In some embodiments, the mesh frame 44a of one of the mesh units 44 may have a portion P3 corresponding to one of the mesh openings 44b and a portion P4 corresponding to one of the mesh openings 44c, and a width W5 of the portion P3 may be greater than a width W6 of the portion P4. The case that the width W3 of the portion P1 is greater than the width W4 of the portion P2 and the case that the width W5 of the portion P3 is greater than the width W6 of the portion P4 may exist at the same time, or one of them may exist. Also, at least one of these cases may be adapted to the mesh units 18 and/or mesh units 44 of any other embodiment. In some embodiments, all of the mesh units 18 and the mesh units 44 of the display panel may adopt the left portion LP1 of FIG. 7 or the right portion RP1 of FIG. 7 or adopt both the left portion LP1 of FIG. 7 and the right portion RP1 of FIG. 7, but not limited thereto. In some embodiments, the left portion LP1 and/or the right portion RP1 of FIG. 7 may be adapted to any one of the embodiments of FIG. 1 to FIG. 6 and FIG. 8 to FIG. 12 mentioned above.

Figure 8:
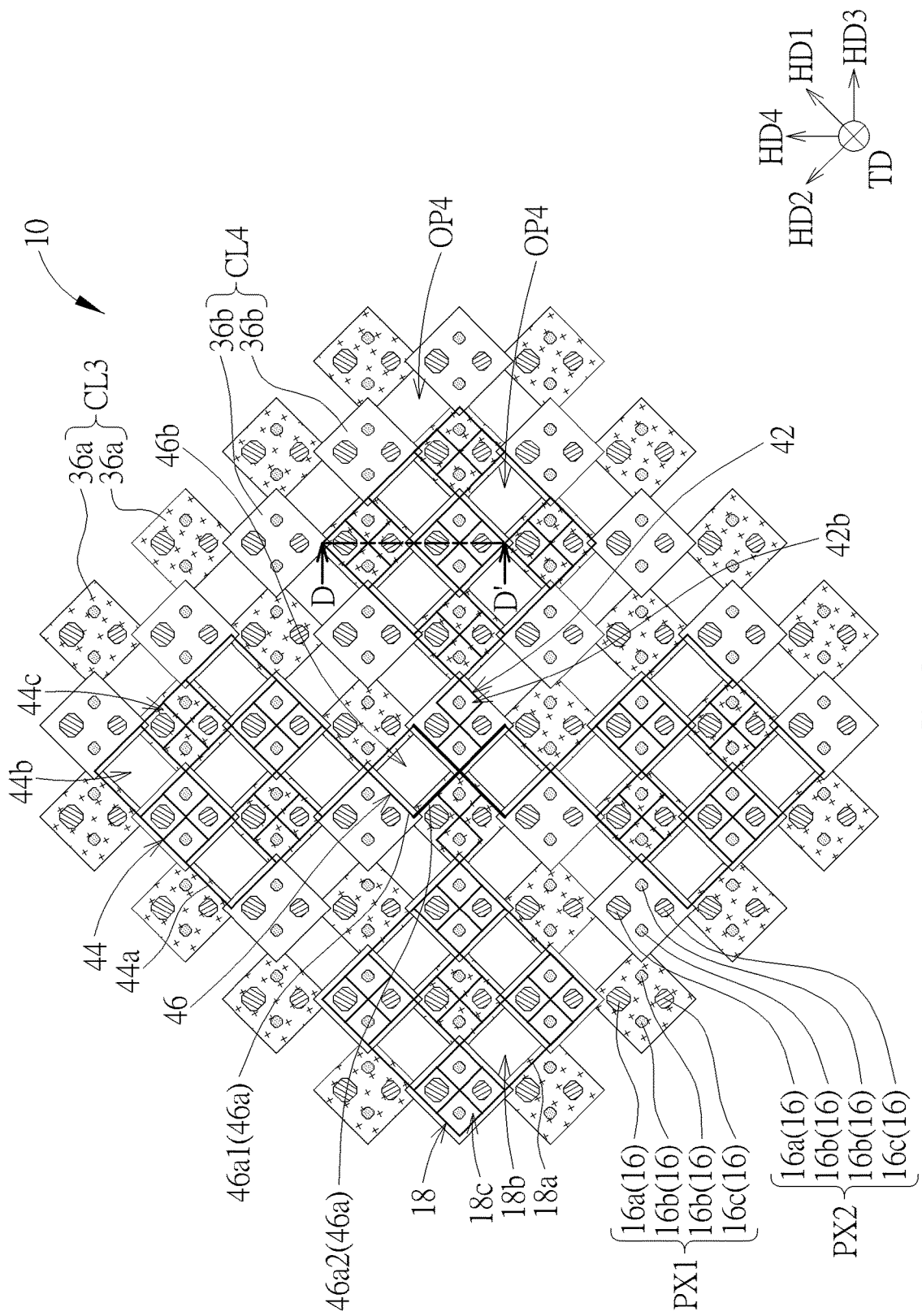
FIG. 8 schematically illustrates a top view of a portion of the display panel corresponding to the first display region according to some embodiments of the present disclosure.
Figure 9:
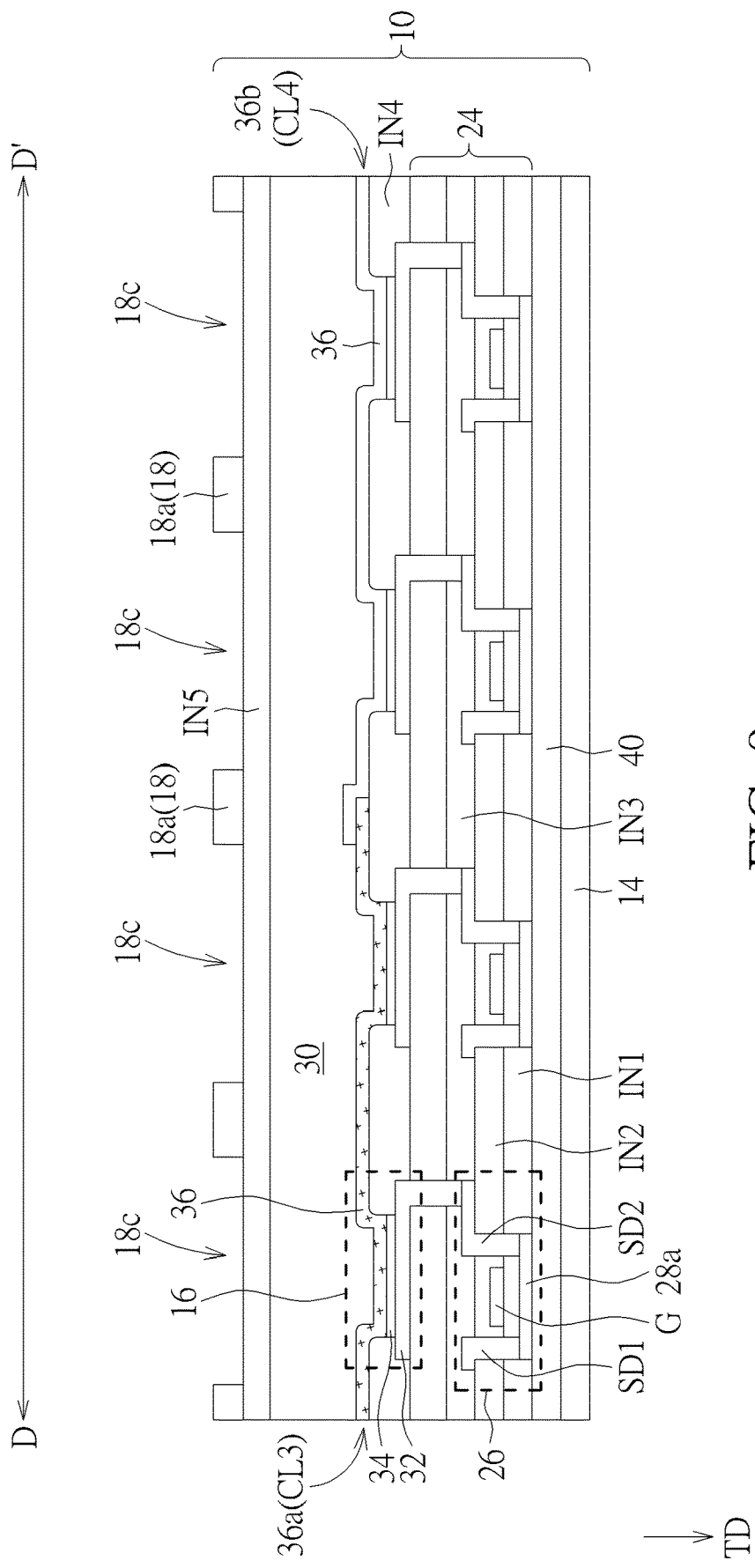
FIG. 9 schematically illustrates a cross-sectional view of the display panel taken along a line D-D' of FIG. 8.

FIG. 8 schematically illustrates a top view of a portion of the display panel corresponding to the first display region according to some embodiments of the present disclosure, and FIG. 9 schematically illustrates a cross-sectional view of the display panel taken along a line D-D' of FIG. 8. As shown in FIG. 8 and FIG. 9, in some embodiments, the second electrodes 36 of different light-emitting units 16 may be optionally formed of different conductive layers CL3 and CL4. Specifically, the display panel 10 may include a plurality of conductive blocks 36a and a plurality of conductive blocks 36b, in which the conductive blocks 36a are separated from each other and are formed of the conductive layer CL3, and the conductive blocks 36b are separated from each other and are formed of the conductive layer CL4. In the embodiment of FIG. 8, the conductive blocks 36a and the conductive blocks 36b may be arranged in an array. The conductive blocks 36a and the conductive blocks 36b of the same row may be alternately arranged along the horizontal direction HD3, and the conductive blocks 36a and the conductive blocks 36b of the same column may be alternately arranged along the horizontal direction HD4, but the arrangement of the conductive blocks 36a and the conductive blocks 36b of the present disclosure is not limited thereto. One of the conductive blocks 36b may be disposed between two adjacent conductive blocks 36a, and one of the conductive blocks 36b may overlap the conductive blocks 36a adjacent thereto in the top view direction TD, such that two adjacent conductive blocks 36a and two adjacent conductive blocks 36b may form an opening OP4 that is surrounded by these two adjacent conductive blocks 36a and these two adjacent conductive blocks 36b. Accordingly, the conductive blocks 36a and the conductive blocks 36b may form a plurality of openings OP4. In the top view direction TD, the mesh openings 18b and the mesh openings 44b may respectively overlap the openings OP4. The size of one of the mesh openings 18b and/or the size of one of the mesh openings 44b may be, for example, greater than a size of one of the openings OP4. In the embodiment of FIG. 8, the conductive blocks 36a and the conductive blocks 36b may be, for example, rhombus or other suitable shapes.

In the embodiment of FIG. 9, the conductive blocks 36b may extend to be on the adjacent conductive blocks 36a and to be electrically connected to the conductive blocks 36a adjacent thereto, but not limited thereto. One of the conductive blocks 36a and one of the conductive blocks 36b adjacent thereto may have an overlapping portion in the top view direction TD, and the overlapping portion may overlap the mesh frame 18a or the mesh frame 44a in the top view direction TD.

In the embodiment of FIG. 8 and FIG. 9, one of the conductive blocks 36a may overlap one pixel PX1 in the top view direction TD, and one of the conductive blocks 36b may overlap one pixel PX2 in the top view direction TD. In other words, the second electrodes 36 of the light-emitting units of the pixel PX1 may be formed of one of the conductive blocks 36a, and the second electrodes 36 of the light-emitting units of the pixel PX2 may be formed of one of the conductive blocks 36b. A size of one of the conductive blocks 36a and a size of one of the conductive blocks 36b of the present disclosure are not limited to the mentioned above. In some embodiments, one of the conductive blocks 36a and/or one of the conductive blocks 36b may serve as the second electrode 36 of at least one light-emitting unit 16.

It should be noted that, it is hard to form the openings OP4 by etching the second electrodes 36 of the light-emitting units 16, or a problem of uneven quality of the second electrodes 36 easily occurs. In this embodiment, the conductive blocks 36a and the conductive blocks 36b may be formed by, for example, using a physical deposition process (e.g., evaporation) with a metal mask and sequentially forming the conductive layer CL3 and the conductive layer CL4 on the light-emitting layer 34 and the insulating layer IN4 through openings of the metal mask. Accordingly, the method of separately forming the conductive blocks 36a and the conductive blocks 36b that are staggered to form the openings OP4 does not require etching the second electrodes 36, thereby improving the quality of the light-emitting units 16 and the quality of the openings OP4.

In some embodiments, as shown in FIG. 8, the size of one of the mesh openings 46b of the bridge unit 46 may be optionally greater than the size of one of the openings OP4 or one of the mesh openings 42b of the bridge unit 42, but not limited thereto. In some embodiments, the size of one of the mesh openings 46b of the bridge unit 46 may be less than the size of one of the openings OP4. The size of one of the mesh openings 46b shown in FIG. 8 may be adapted to at least one mesh opening 46b of other embodiments.

Figure 10:
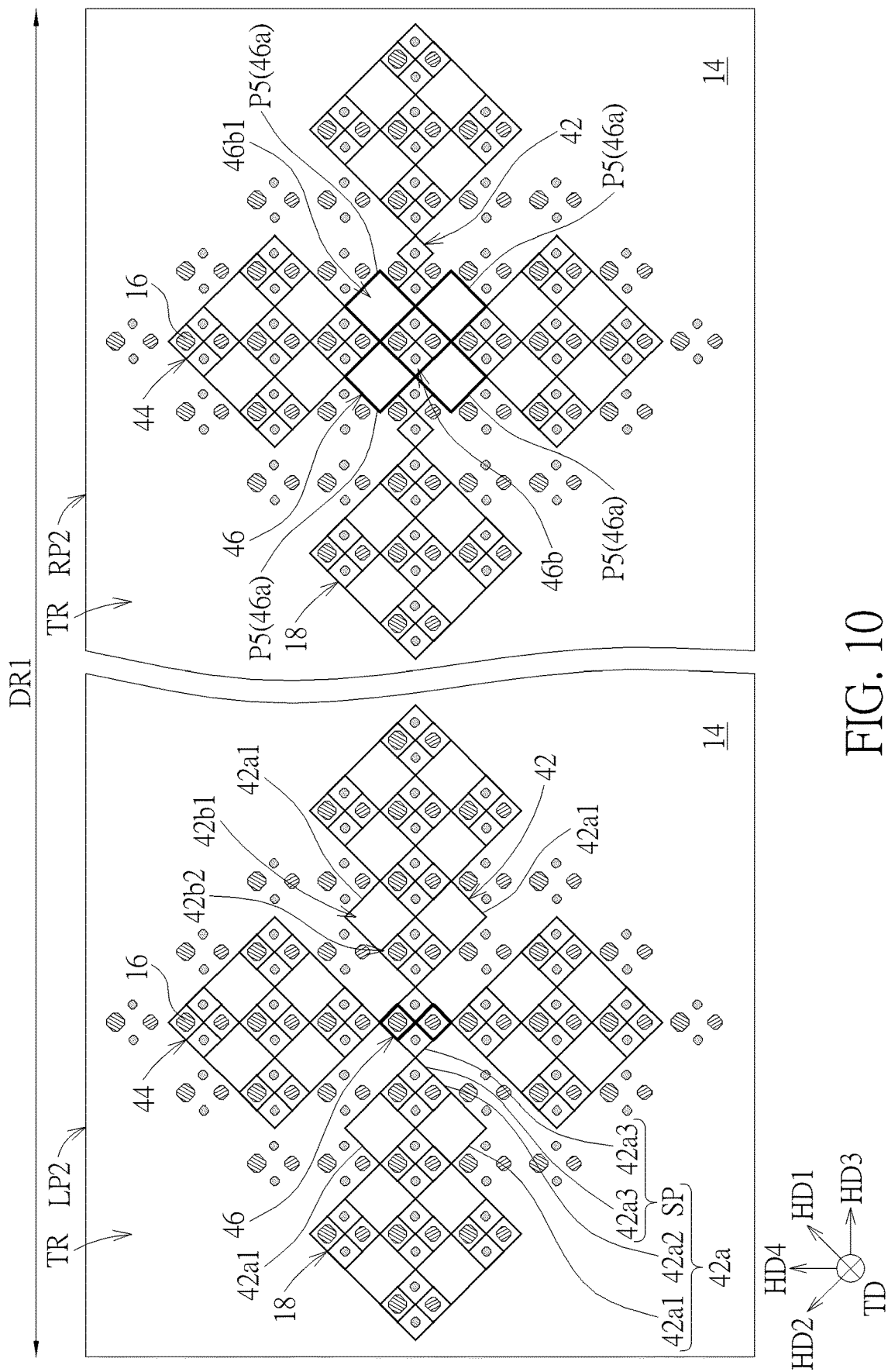
FIG. 10 schematically illustrates top views of different portions of the display panel corresponding to the first display region according to some embodiments of the present disclosure.

FIG. 10 schematically illustrates top views of different portions of the display panel corresponding to the first display region according to some embodiments of the present disclosure. As shown in a left portion LP2 of FIG. 10, in some embodiments, the strip-shaped mesh 42a of the bridge unit 42 may include a strip-shaped part SP and at least one grid frame 42a1, and the grid frame 42a1 may be electrically connected to the strip-shaped part SP and one of the mesh units 18 to reduce resistance of the bridge unit 42. The grid frame 42a1 may have one opening 42b1, and the opening 42b1 may not overlap the light-emitting units 16 in the top view direction TD. In the embodiment of FIG. 10, the strip-shaped part SP may, for example, be the same as the left portion LP1 of FIG. 7 or the strip-shaped mesh 42a of FIG. 5. As an example, the strip-shaped part SP may include six mesh frames 42a3 arranged along an extending direction of the strip-shaped mesh 42a (e.g., the horizontal direction HD3) and electrically connected to two adjacent mesh units 18. The difference between the strip-shaped mesh 42a in FIG. 10 and the strip-shaped mesh 42a in the left portion LP1 of FIG. 7 is that the strip-shaped mesh 42a may further include four grid frames 42a1, and one of which is electrically connected to one side of the strip-shaped part SP and a corresponding one of the mesh units 18, but not limited thereto. In some embodiments, the strip-shaped mesh 42a may further include at least one grid frame 42a2 electrically connected to one side of the strip-shaped part SP. The grid frame 42a2 may have an opening 42b2, and the opening 42b2 may overlap at least one light-emitting unit 16 in the top view direction TD. In the embodiment of FIG. 10, the strip-shaped mesh 42a may include four grid frames 42a2, in which each of the grid frames 42a2 may have an opening 42b2, and one of the openings 42b2 may overlap one light-emitting unit 16 in the top view direction TD. In some embodiments, the grid frame 42a1 and/or the grid frame 42a2 in the left portion LP2 of FIG. 10 may be adapted to the right portion RP2 of FIG. 10 or other embodiments.

As shown in the right portion RP2 of FIG. 10, in some embodiments, one of the mesh openings 46b of the strip-shaped mesh 46a may overlap one light-emitting unit 16 in the top view direction TD. In the embodiment of FIG. 10, the strip-shaped mesh 46a may optionally further include at least one grid frame P5, and the grid frame P5 may have an opening 46b1 which may not overlap the light-emitting units 16 in the top view direction TD, but not limited thereto. In some embodiments, the grid frame P5 in the right portion RP2 of FIG. 10 may be adapted to the left portion LP2 of FIG. 10 or other embodiments.

Figure 11:
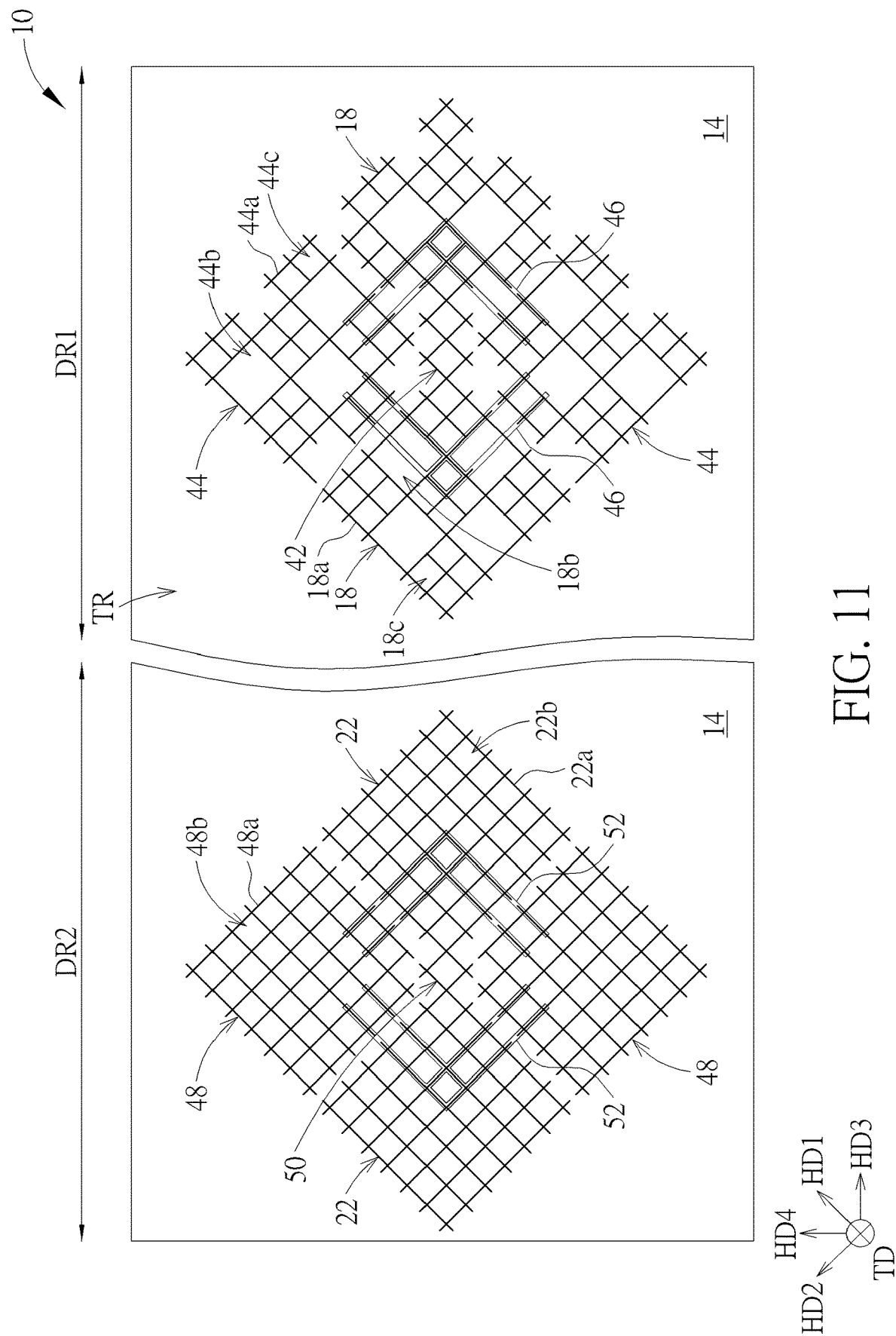
FIG. 11 schematically illustrates top views of portions of a display panel corresponding to the first display region and the second display region according to some embodiments of the present disclosure.

FIG. 11 schematically illustrates top views of portions of a display panel corresponding to the first display region and the second display region according to some embodiments of the present disclosure. In order to clearly show the mesh units 18, the mesh units 44, the mesh units 22, the mesh units 48, the bridge unit 42, the bridge unit 46, the bridge unit 50 and the bridge unit 52 of the display panel 10, the light-emitting units 16 and the light-emitting units 20 are omitted in FIG. 11, but not limited thereto. As shown in FIG. 11, the display panel 10 may include two bridge units 46 connected between adjacent two of the mesh units 44. In the embodiment of FIG. 11, the bridge units 46 may not overlap the bridge unit 42 in the top view direction TD but overlap one of the mesh units 18 adjacent thereto, but not limited thereto. Since the bridge units 46 and the mesh units 18 may be formed of different conductive layers (e.g., the conductive layer CL1 and the conductive layer CL2 shown in FIG. 6), and a dielectric layer (e.g., the insulating layer IN6 shown in FIG. 6) may be disposed between the bridge unit 46 and the mesh units 18, the bridge unit 46 and the mesh units 18 may be electrically insulated from each other. In some embodiments, the bridge units 46 may optionally be symmetrical to each other with respect to the arrangement direction of the mesh units 44 (e.g., the horizontal direction HD4), but not limited thereto. In some embodiments, one of the bridge units 46 may, for example, overlap at least one mesh opening 18b in the top view direction TD, but not limited thereto.

In addition, as shown in FIG. 11, the display panel 10 may further include two bridge units 52 connected between adjacent two of the mesh units 48. In the embodiment of FIG. 11, the bridge units 52 may not overlap the bridge units 50 in the top view direction TD, but overlap the mesh units 22 adjacent thereto, but not limited thereto. Furthermore, the bridge units 52 and the mesh units 22 may be formed of different conductive layers (e.g., the conductive layer CL1 and the conductive layer CL2 shown in FIG. 6) and may be electrically insulated from each other through the dielectric layer (e.g., the insulating layer IN6 shown in FIG. 6).

Figure 12:
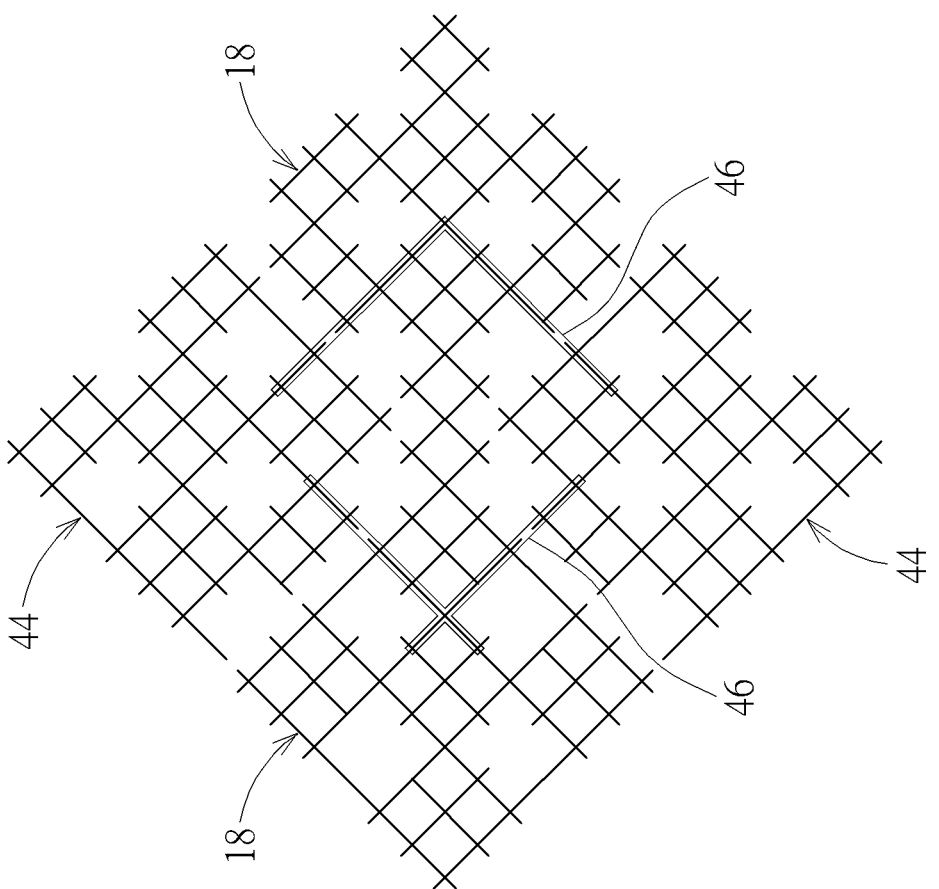
FIG. 12 schematically illustrates a top view of a mesh unit and a bridge unit according to some embodiments of the present disclosure.

FIG. 12 schematically illustrates a top view of a mesh unit and a bridge unit according to some embodiments of the present disclosure. As shown in FIG. 12, in some embodiments, the bridge units 46 may be asymmetrical to each other with respect to the arrangement direction of the mesh units 44 (e.g., the horizontal direction HD4).

Figure 13:
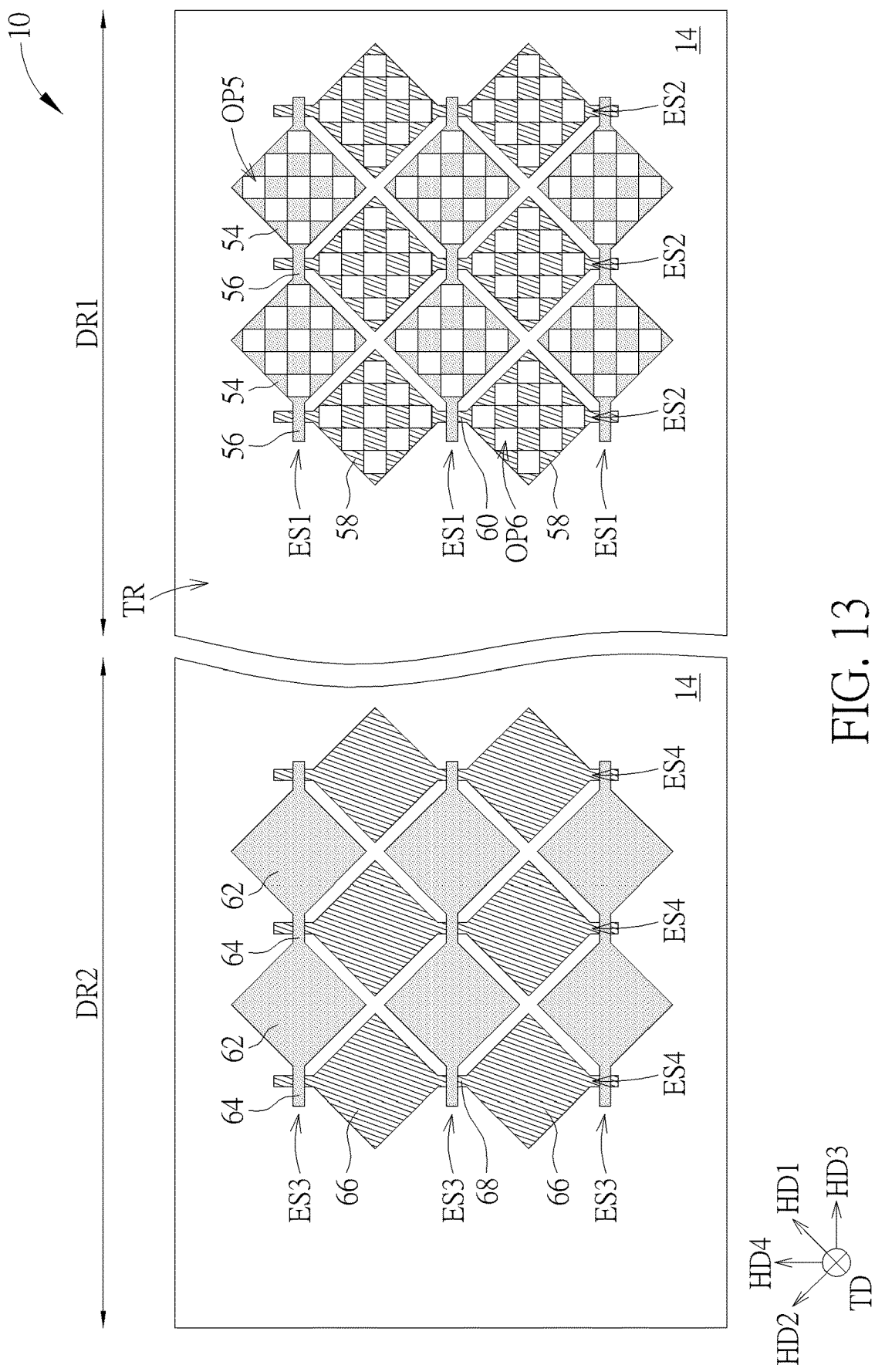
FIG. 13 schematically illustrates top views of portions of a display panel corresponding to the first display region and the second display region according to some embodiments of the present disclosure.

FIG. 13 schematically illustrates top views of portions of a display panel corresponding to the first display region and the second display region according to some embodiments of the present disclosure. As shown in FIG. 13, the display panel 10 may include a plurality of transparent sensing electrodes 54, a plurality of bridging lines 56, a plurality of transparent sensing electrodes 58 and a plurality of bridging lines 60 disposed on the first display region DR1 of the substrate 14. The transparent sensing electrodes 54 and the bridge lines 56 may be electrically connected to form a plurality of electrode strings ES1 electrically insulated from each other, and the transparent sensing electrodes 58 and the bridge lines 60 may be electrically connected to form a plurality of electrode strings ES2 electrically insulated from each other. In the top view direction TD, the electrode strings ES1 may overlap the electrode strings ES2. It should be noted that one of the transparent sensing electrodes 54 may have a plurality of openings OP5, and one of the transparent sensing electrodes 58 may have a plurality of openings OP6. In FIG. 13, one of the openings OP5 may be similar to or the same as one of the mesh openings 18b shown in FIG. 5, and one of the openings OP5 may overlap the transparent area TR or may not overlap the light-emitting units (e.g., the light-emitting units 16 shown in FIG. 5) in the top view direction TD. One of the openings OP6 may be similar to or the same as one of the mesh openings 44b shown in FIG. 5, and one of the openings OP6 may overlap the transparent area TR or may not overlap the light-emitting units in the top view direction TD. In order to clearly show the electrode strings ES1, the electrode strings ES2, the electrode strings ES3 and the electrode strings ES4 of the display panel 10, the light-emitting units 16 and the light-emitting units 20 are omitted in FIG. 13, but not limited thereto.

As shown in FIG. 13, the display panel 10 may further include a plurality of transparent sensing electrodes 62, a plurality of bridge lines 64, a plurality of transparent sensing electrodes 66, and a plurality of bridge lines 68 disposed on the second display region DR2 of the substrate 14. The transparent sensing electrodes 62 and the bridge lines 64 may be electrically connected to form a plurality of electrode strings ES3 electrically insulated from each other, and the transparent sensing electrodes 66 and the bridge lines 68 may be electrically connected to form a plurality of electrode strings ES4 electrically insulated from each other. In the top view direction TD, the electrode strings ES3 may overlap the electrode strings ES4. In some embodiments, when one of the electrode strings ES3 and a corresponding one of the electrode strings ES1 are arranged along the same line, the electrode string ES3 and the corresponding electrode string ES1 may be electrically connected to each other. Similarly, when one of the electrode strings ES4 and a corresponding one of the electrode strings ES2 are arranged along the same line, the electrode string ES4 and the corresponding electrode string ES2 may be electrically connected to each other.

In some embodiments, the transparent sensing electrodes 54 and the bridge lines 56 may be formed of a transparent conductive layer, and the transparent sensing electrodes 58 and the bridge lines 60 may be formed of another transparent conductive layer. A dielectric layer (e.g., the insulating layer IN6 shown in FIG. 6) may be disposed between these two transparent conductive layers, but not limited thereto. In some embodiments, the transparent sensing electrodes 54 and the transparent sensing electrodes 58 may be formed of the same transparent conductive layer as one of the bridge lines 56 and the bridge lines 60, and the other one of the bridge lines 56 and the bridge lines 60 may be formed of another transparent conductive layer. Similarly, in some embodiments, the forming method of the transparent sensing electrodes 62, the bridging lines 64, the transparent sensing electrodes 66, and the bridging lines 68 may be similar to or the same as that of the transparent sensing electrodes 54, the transparent sensing electrodes 58, the bridging lines 56 and the bridging lines 60 and will not be redundantly detailed. The transparent conductive layer may, for example, include indium tin oxide, indium zinc oxide, or other suitable transparent conductive materials.

Figure 14:
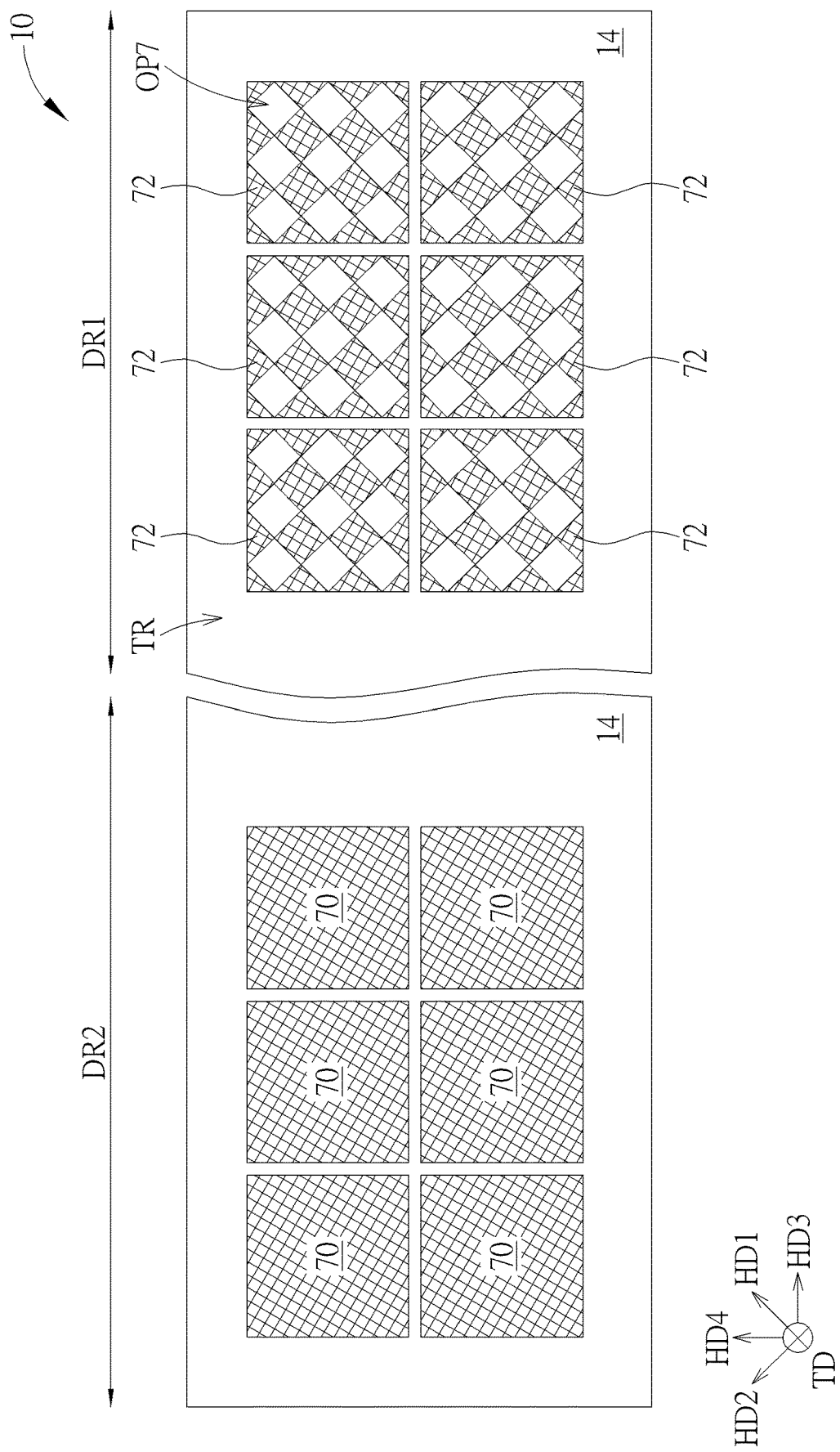
FIG. 14 schematically illustrates top views of portions of the display panel corresponding to the first display region and the second display region according to some embodiments of the present disclosure.

FIG. 14 schematically illustrates top views of portions of the display panel corresponding to the first display region and the second display region according to some embodiments of the present disclosure. As shown in FIG. 14, in some embodiments, the touch sensing device may be self-capacitance type. Specifically, the display panel 10 may include a plurality of transparent sensing electrodes 72 and a plurality of transparent sensing electrodes 70, in which the transparent sensing electrodes 72 are separated from each other and disposed on the first display region DR1 of the substrate 14, and the transparent sensing electrodes 70 are separated from each other and disposed on the second display region DR2 of the substrate 14. It should be noted that one of the transparent sensing electrodes 72 may have a plurality of openings OP7. In FIG. 14, one of the openings OP7 may be similar to or the same as one of the mesh openings 18b of FIG. 5 and may not overlap the light-emitting units in the top view direction TD. The transparent sensing electrodes 72 may be arranged in an array, for example. The transparent sensing electrodes 70 may also be arranged in an array, for example. In addition, the transparent sensing electrodes 72 and the transparent sensing electrodes 70 may be separately electrically connected to elements or pads in the peripheral region through connecting lines (not shown). In some embodiments, the transparent sensing electrodes 72 and the transparent sensing electrodes 70 may include, for example, indium tin oxide, indium zinc oxide, or other suitable transparent conductive materials.

Figure 15:
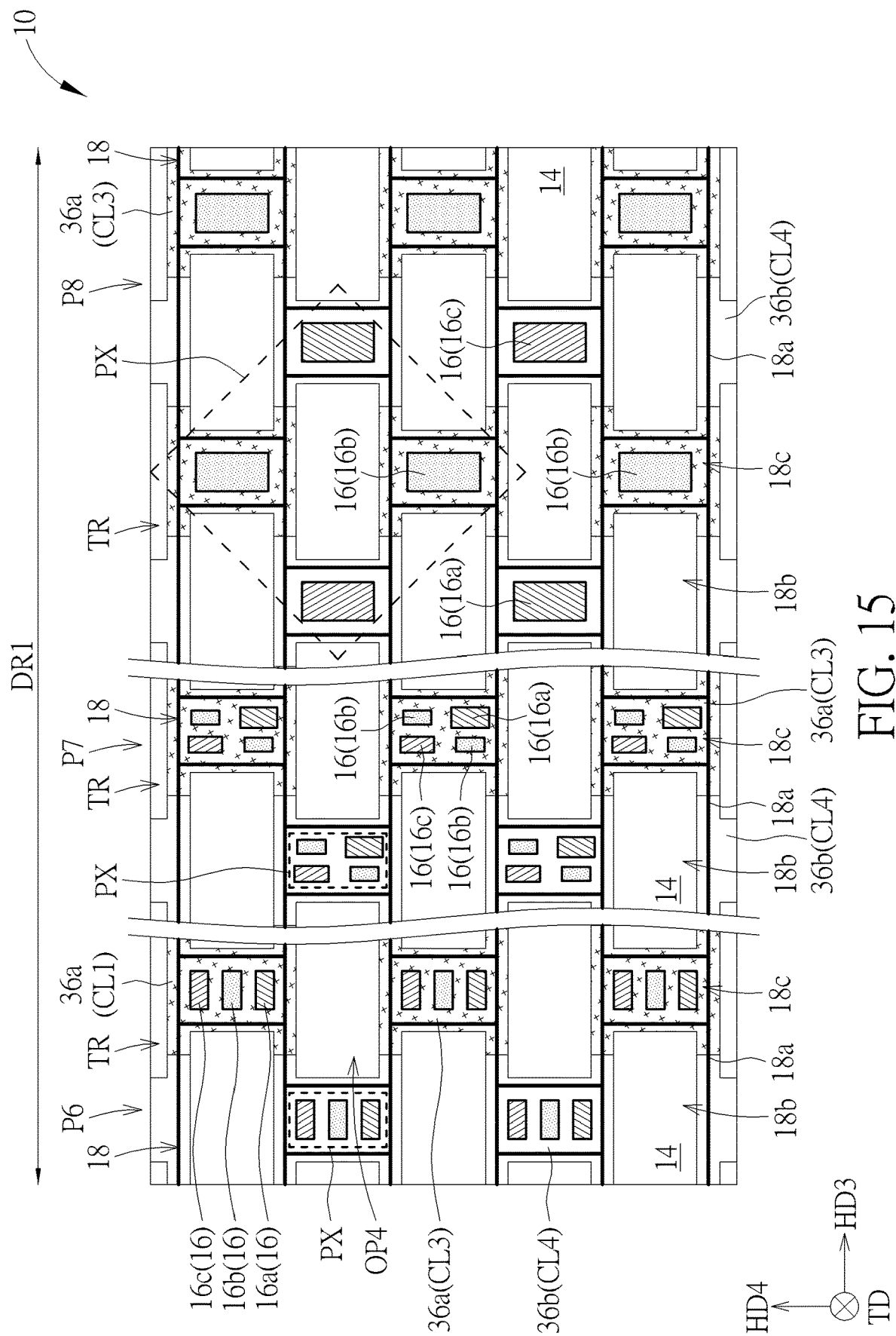
FIG. 15 schematically illustrates top views of different portions of the display panel corresponding to the first display region according to some embodiments of the present disclosure.

FIG. 15 schematically illustrates top views of different portions of the display panel corresponding to the first display region according to some embodiments of the present disclosure. As shown in FIG. 15, in the display panel 10 of some embodiments, when the size of one of the mesh openings 18b is greater than the size of one of the mesh openings 18c, the second electrodes of different light-emitting units 16 may be formed of different conductive layers CL3 and CL4. Specifically, the display panel 10 may include a plurality of conductive blocks 36a and a plurality of conductive blocks 36b, in which the conductive blocks 36a are separated from each other and formed of the conductive layer CL3, and the conductive blocks 36b are separated from each other and formed of the conductive layer CL4. The conductive blocks 36a and the conductive blocks 36b may form a plurality of openings OP4. Each mesh opening 18b or a corresponding mesh opening (e.g., the mesh opening 44b shown in FIG. 5) may overlap a corresponding one of the openings OP4 in the top view direction TD. Two adjacent conductive blocks 36a may be connected to each other through two adjacent conductive blocks 36b, such that these two adjacent conductive blocks 36a and these two adjacent conductive blocks 36b may surround one of the openings OP4. In the embodiment of FIG. 15, a top-view shape of one of the conductive blocks 36a and a top-view shape of one of the conductive blocks 36b may be, for example, I-shaped, so that the size of one of the formed openings OP4 may be close to the size of one of the mesh openings 18b, but not limited thereto. In the top view direction TD, the conductive blocks 36a and the conductive blocks 36b may be arranged in an array and staggered. In other words, the conductive blocks 36a of each column and the conductive blocks 36b of each column are alternately arranged along the horizontal direction HD3, and the conductive blocks 36a of each row and the conductive blocks 36b of each row are alternately arranged along the horizontal direction HD4.

In the portion P6 and the portion P7 of FIG. 15, one of the mesh openings 18c may overlap one of the pixels PX, and the conductive blocks 36a and the conductive blocks 36b may serve as the second electrodes of the pixels PX, respectively. In the portion P6 of FIG. 15, the light-emitting units 16 of one of the pixels PX corresponding to the same one of the mesh openings 18c may be arranged along the same direction, for example, along the horizontal direction HD4, but not limited thereto. In the portion P7 of FIG. 15, the light-emitting units 16 of one of the pixels PX corresponding to the same one of the mesh openings 18c may be arranged in an array, but not limited thereto. In the portion P8 of FIG. 15, one of the mesh openings 18c may overlap one of the light-emitting units 16 or one of the sub-pixels, and one of the conductive blocks 36a and the conductive blocks 36b may serve as the second electrode of a corresponding one of the first light-emitting units 16 or the sub-pixels. In some embodiments, all of the arrangement of the light-emitting units 16 and the corresponding relationship between the light-emitting units 16 and the corresponding mesh openings 18c of the display panel 10 may adopt a design of one of the portion P6, the portion P7, and the portion P8 of FIG. 15, or the arrangement of the light-emitting units 16 and the corresponding relationship between the light-emitting units 16 and the corresponding mesh openings 18c of the display panel 10 may adopt designs of at least two of the portion P6, the portion P7, and the portion P8 of FIG. 15, but not limited thereto. In some embodiments, the arrangement of the light-emitting units 16 and the corresponding relationship between the light-emitting units 16 and the corresponding mesh openings 18c in the portion P6, the portion P7, and/or the portion P8 of FIG. 15 may be adapted to any one of the above embodiments shown in FIG. 1 to FIG. 12.

In summary, in the electronic device of the present disclosure, the mesh openings that do not overlap the light-emitting units are provided in the mesh units and the bridge units corresponding to the first display region, or openings that do not overlap the light-emitting units are provided in the transparent sensing electrodes, such that the transmittances of portions of the display panel corresponding to the mesh openings or the openings are improved. Accordingly, the optical sensor corresponding to the first display region is able to detect light with higher intensity, thereby improving the quality of the detected images.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display panel, comprising:
a substrate having a first display region, wherein the first display region comprises a transparent area;
a plurality of first light-emitting units disposed in the first display region and outside the transparent area in a top view direction of the display panel;
a plurality of first mesh units disposed in the first display region in the top view direction of the display panel, wherein each of the plurality of first mesh units has a first mesh frame, and the first mesh frame forms a plurality of first mesh openings; and
a plurality of second mesh units disposed on the first display region of the substrate, wherein the plurality of second mesh units and the plurality of first mesh units are arranged in different directions, and one of the plurality of first mesh units and one of the plurality of second mesh units are different in mesh pattern;
wherein the transparent area overlaps at least one of the plurality of first mesh openings in the top view direction of the display panel.

2. The display panel as claimed in claim 1, wherein the first mesh frame has an outline in the top view direction of the display panel, and a part of the outline is curved.

3. The display panel as claimed in claim 1, wherein the first mesh frame further forms a plurality of second mesh openings, wherein one of the plurality of second mesh openings overlaps at least one of the plurality of first light-emitting units in the top view direction of the display panel.

4. The display panel as claimed in claim 3, wherein a ratio of a width of one of the plurality of first mesh openings to a width of one of the plurality of second mesh openings is greater than or equal to 1.01 and less than or equal to 5.

5. The display panel as claimed in claim 1, wherein each of the plurality of second mesh units has a second mesh frame, the second mesh frame forms a plurality of third mesh openings, the plurality of third mesh openings do not overlap the plurality of first light-emitting units in the top view direction of the display panel, and the plurality of first mesh openings and the plurality of third mesh openings are different in numbers.

6. The display panel as claimed in claim 1, wherein the substrate further comprises a second display region, and the display panel further comprises:
a plurality of second light-emitting units disposed in the second display region in the top view direction of the display panel; and
a plurality of third mesh units disposed in the second display region in the top view direction of the display panel, wherein one of the plurality of third mesh units comprises a plurality of fourth mesh openings, and one of the plurality of fourth mesh openings overlaps at least one of the plurality of second light-emitting units in the top view direction of the display panel.

7. The display panel as claimed in claim 6, wherein the one of the plurality of first mesh units and the one of the plurality of third mesh units are different in mesh pattern.

8. An electronic device, comprising:
a display panel, comprising:
  a substrate having a first display region, wherein the first display region comprises a transparent area;
  a plurality of first light-emitting units disposed in the first display region and outside the transparent area in a top view direction of the display panel;
  a plurality of first mesh units disposed in the first display region in the top view direction of the display panel, wherein each of the plurality of first mesh units has a first mesh frame, and the first mesh frame forms a plurality of first mesh openings; and
  a plurality of second mesh units disposed on the first display region of the substrate, wherein the plurality of second mesh units and the plurality of first mesh units are arranged in different directions, each of the plurality of second mesh units has a second mesh frame, the second mesh frame forms a plurality of second mesh openings, the plurality of second mesh openings do not overlap the plurality of first light-emitting units in the top view direction of the display panel, and the plurality of first mesh openings and the plurality of second mesh openings are different in numbers, and wherein the transparent area overlaps at least one of the plurality of first mesh openings in the top view direction of the display panel; and
an optical sensor disposed under the first display region of the substrate.

9. The electronic device as claimed in claim 8, wherein the optical sensor is for sensing a visible light.

10. The electronic device as claimed in claim 8, wherein the optical sensor is for sensing a non-visible light.

11. A display panel, comprising:
  a substrate having a first display region and a second display region, wherein the first display region comprises a transparent area;
  a plurality of first light-emitting units disposed in the first display region and outside the transparent area in a top view direction of the display panel;
  a plurality of first mesh units disposed in the first display region in the top view direction of the display panel, wherein each of the plurality of first mesh units has a first mesh frame, and the first mesh frame forms a plurality of first mesh openings;
  a plurality of second light-emitting units disposed in the second display region in the top view direction of the display panel; and
  a plurality of second mesh units disposed in the second display region in the top view direction of the display panel, wherein one of the plurality of second mesh units comprises a plurality of second mesh openings, and one of the plurality of second mesh openings overlaps at least one of the plurality of second light-emitting units in the top view direction of the display panel,
  wherein the transparent area overlaps at least one of the plurality of first mesh openings in the top view direction of the display panel, and
  wherein one of the plurality of first mesh units and the one of the plurality of second mesh units are different in mesh pattern.

* * * * *